(12) United States Patent
Takahashi et al.

(10) Patent No.: US 8,866,127 B2
(45) Date of Patent: Oct. 21, 2014

(54) NITRIDE SEMICONDUCTOR LIGHT-EMITTING ELEMENT INCLUDING SI-DOPED LAYER, AND LIGHT SOURCE

(71) Applicant: Panasonic Corporation, Osaka (JP)

(72) Inventors: Kunimasa Takahashi, Osaka (JP); Ryou Kato, Osaka (JP); Shunji Yoshida, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/064,451

(22) Filed: Oct. 28, 2013

(65) Prior Publication Data

US 2014/0048771 A1 Feb. 20, 2014

Related U.S. Application Data

(63) Continuation of application No. PCT/JP2013/001290, filed on Mar. 4, 2013.

(30) Foreign Application Priority Data

Mar. 5, 2012 (JP) ................. 2012-048324

(51) Int. Cl.
*H01L 29/06* (2006.01)
(Continued)

(52) U.S. Cl.
CPC ............ *H01L 33/14* (2013.01); *H01L 33/0075* (2013.01); *H01L 33/007* (2013.01); *H01L 21/02433* (2013.01); *H01L 21/02389* (2013.01); *H01L 33/325* (2013.01); *H01L 33/06* (2013.01); *H01L 21/02579* (2013.01); *H01L 33/16* (2013.01); *H01L 21/02576* (2013.01); *H01L 21/0254* (2013.01); *H01L 21/0262* (2013.01); *H01L 21/02507* (2013.01); *H01L 21/02458* (2013.01)
USPC ......................................................... 257/14

(58) Field of Classification Search
CPC ....... H01L 33/06; H01L 33/14; H01L 33/007; H01L 33/16; H01L 33/325; H01L 21/02576; H01L 21/0254; H01L 21/02389; H01L 21/02548
USPC ............................................................ 257/14
See application file for complete search history.

(56) References Cited

U.S. PATENT DOCUMENTS 8,044,383 B2 * 10/2011 Zhong et al. ................. 257/13
2001/0010372 A1 8/2001 Takeuchi et al.
(Continued)

FOREIGN PATENT DOCUMENTS

JP 2000-332364 A 11/2000
JP 2003-229645 A 8/2003
(Continued)

OTHER PUBLICATIONS

International Search Report for International Application No. PCT/JP2013/001290 mailed May 7, 2013.
(Continued)

*Primary Examiner* — William D Coleman
(74) *Attorney, Agent, or Firm* — Renner, Otto, Boisselle & Sklar, LLP

(57) ABSTRACT

A nitride semiconductor light-emitting element uses a nonpolar plane as its growing plane. A GaN/InGaN multi-quantum well active layer includes an Si-doped layer which is arranged in an $In_yGa_{1-y}N$ (where $0<y<1$) well layer, between the $In_yGa_{1-y}N$ (where $0<y<1$) well layer and a GaN barrier layer, or in a region of the GaN barrier layer that is located closer to the $In_yGa_{1-y}N$ (where $0<y<1$) well layer. A concentration of Si at one interface of the GaN barrier layer on a growing direction side is either zero or lower than a concentration of Si in the Si-doped layer.

20 Claims, 12 Drawing Sheets

(51) Int. Cl.
 *H01L 31/00* (2006.01)
 *H01L 21/02* (2006.01)
 *H01L 33/32* (2010.01)
 *H01L 33/06* (2010.01)
 *H01L 33/14* (2010.01)
 *H01L 33/16* (2010.01)
 *H01L 33/00* (2010.01)

(56) References Cited

U.S. PATENT DOCUMENTS

| | | |
|---|---|---|
| 2005/0156153 A1 | 7/2005 | Futagawa |
| 2008/0012002 A1 | 1/2008 | Sakong et al. |
| 2008/0232416 A1* | 9/2008 | Okamoto et al. .......... 372/45.01 |
| 2009/0258452 A1 | 10/2009 | Enya et al. |
| 2011/0121265 A1 | 5/2011 | Ueno et al. |

FOREIGN PATENT DOCUMENTS

| | | |
|---|---|---|
| JP | 2004-022989 A | 1/2004 |
| JP | 2010-245444 A | 10/2010 |
| JP | 2011-023539 A | 2/2011 |
| JP | 2011-049452 A | 3/2011 |
| JP | 2011-119374 A | 6/2011 |
| WO | WO 2013/015035 A1 | 1/2013 |

OTHER PUBLICATIONS

Written Opinion for International Application No. PCT/JP2013/001290 with partial English translation dated May 7, 2013.

* cited by examiner

CONVENTIONAL ART
FIG.1
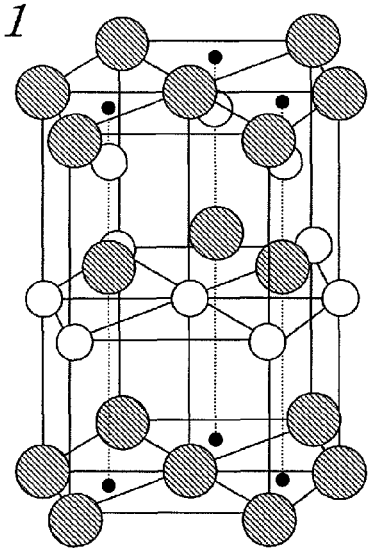
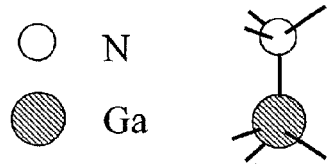
○ N
● Ga
CONVENTIONAL ART
FIG.2
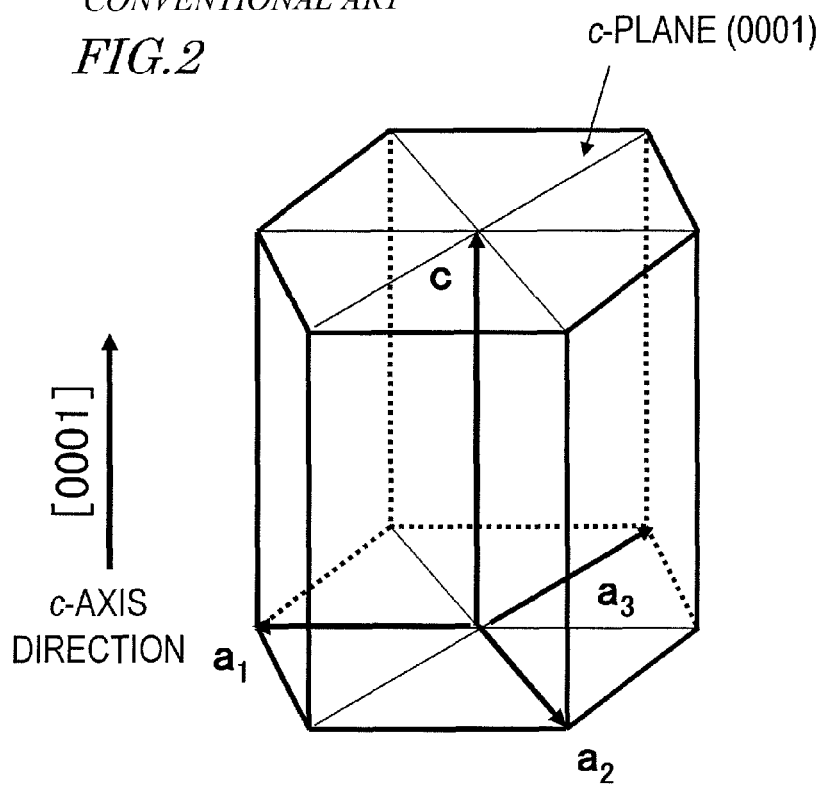

(0001) c-PLANE

C-AXIS (10-10) m-PLANE (11-20) a-PLANE (10-12) r-PLANE

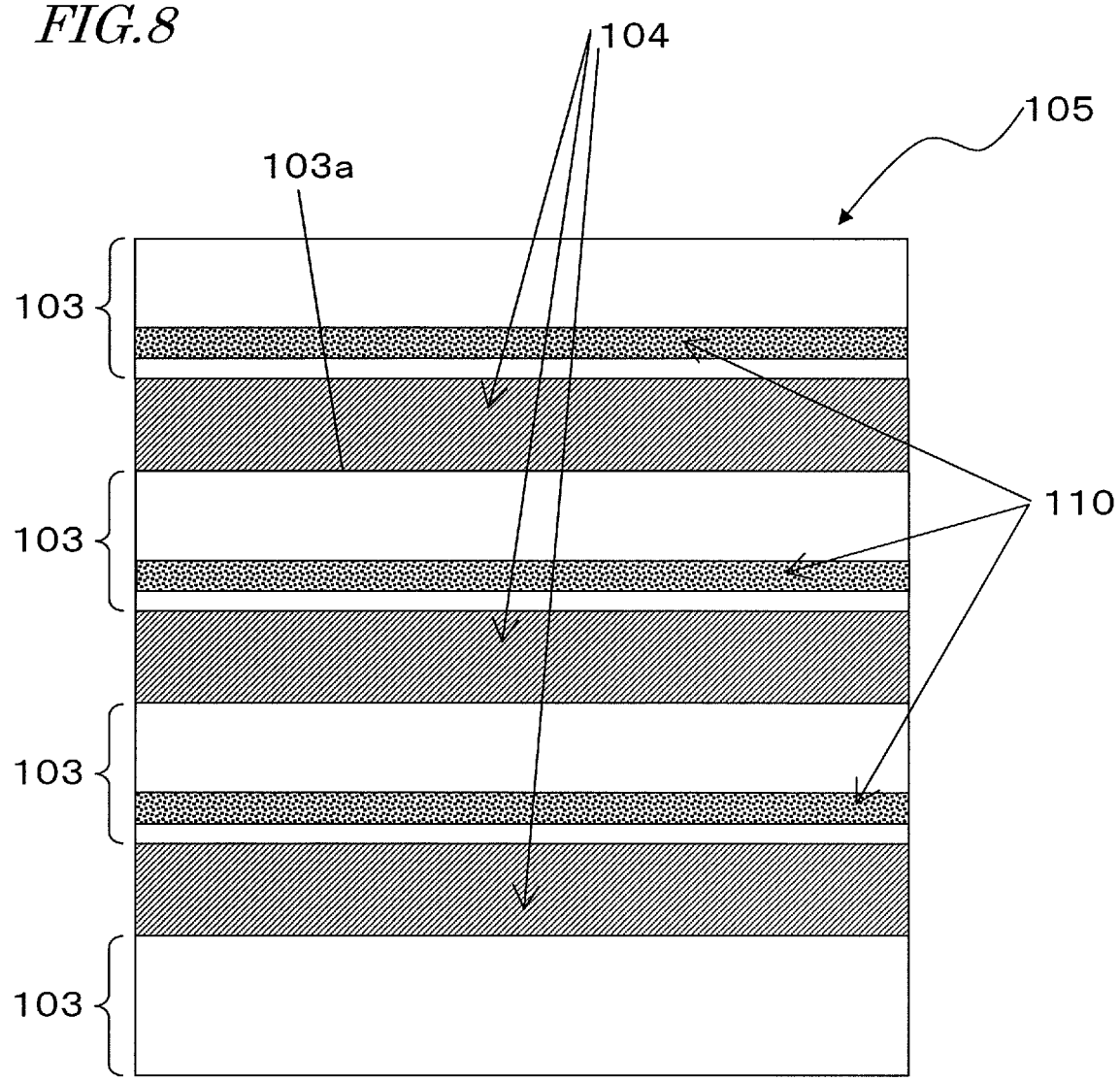

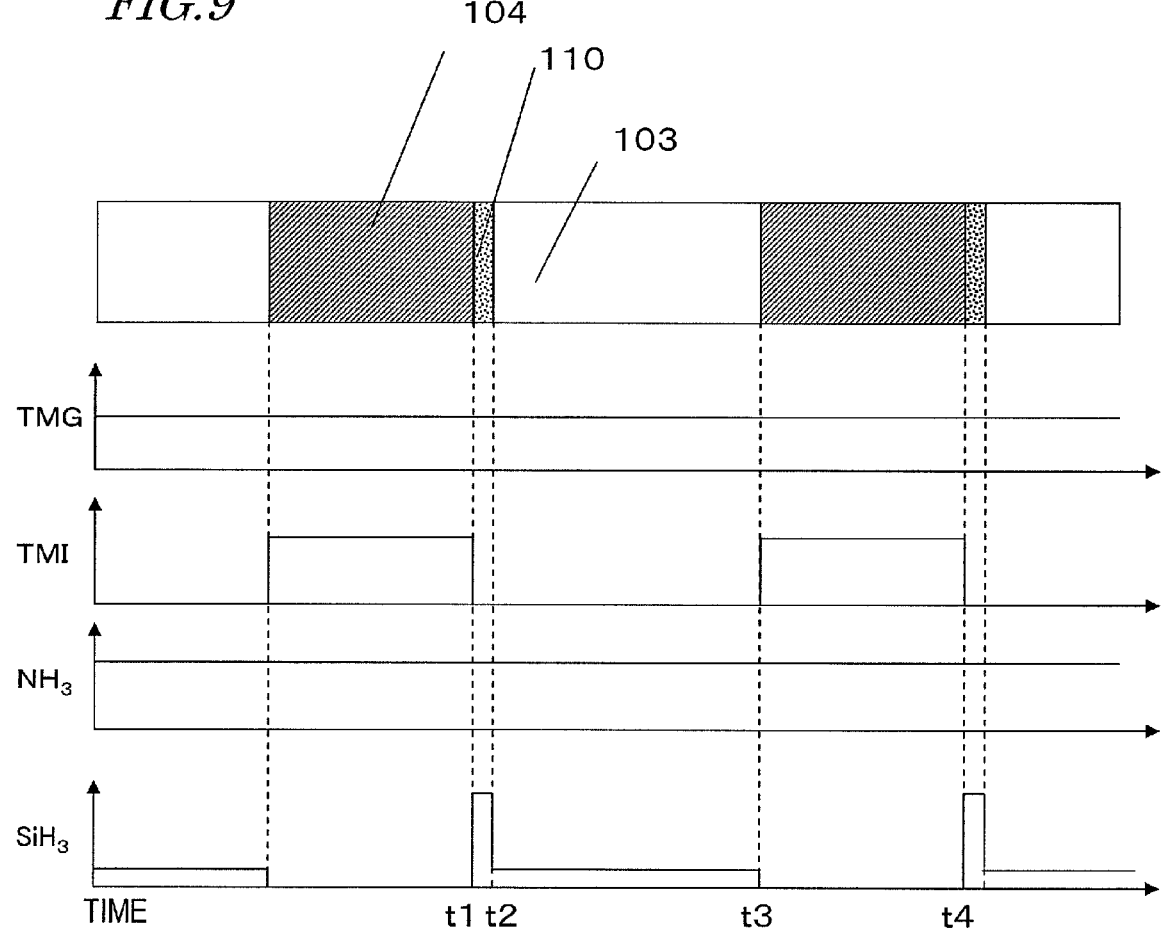

NITRIDE SEMICONDUCTOR LIGHT-EMITTING ELEMENT INCLUDING SI-DOPED LAYER, AND LIGHT SOURCE

This is a continuation of International Application No. PCT/JP2013/001290, with an international filing date of Mar. 4, 2013, which claims priority of Japanese Patent Application No. 2012-048324, filed on Mar. 5, 2012, the contents of which are hereby incorporated by reference.

BACKGROUND

1. Technical Field

The present application relates to a nitride semiconductor light-emitting element including an active layer, of which the growing plane is a non-polar plane, and also relates to a light source including such a light-emitting element and a method for fabricating the light-emitting element.

2. Description of the Related Art

A nitride semiconductor such as GaN, AlN, InN and their mixed crystals has a larger bandgap (Eg) than a GaAs based semiconductor and is a direct transition type semiconductor material. Due to these advantageous features, a nitride semiconductor is a prime candidate for a material to make a short-wave light-emitting element. Among other things, gallium nitride-based compound semiconductors (which will be referred to herein as "GaN-based semiconductors") have been researched and developed particularly extensively. As a result, blue-ray-emitting light-emitting diodes (LEDs), green-ray-emitting LEDs and semiconductor laser diodes formed of GaN-based semiconductors have already been used in actual products.

A GaN-based semiconductor has a hexagonal wurtzite crystal structure. FIG. 1 schematically illustrates a unit cell of GaN-based semiconductor. In an $Al_aGa_bIn_cN$ (where $0 \le a, b, c \le 1$ and $a+b+c=1$) semiconductor crystal, some of the Ga atoms shown in FIG. 1 may be replaced with Al and/or In atoms.

FIG. 2 shows four primitive vectors $a_1$, $a_2$, $a_3$ and c, which are generally used to represent planes of a wurtzite crystal structure with four indices (i.e., hexagonal indices). The primitive vector c runs in the [0001] direction, which is called a "c-axis".

FIG. 3 is a schematic representation illustrating representative crystal planes of the wurtzite crystal structure. FIGS. 3A, 3B, 3C and 3D illustrate a (0001) plane, a (10-10) plane, a (11-20) plane, and a (10-12) plane, respectively. In this case, "–" attached on the left-hand side of a Miller-Bravais index in the parentheses means a "bar" (a negative direction index). The (0001), (10-10), (11-20) and (10-12) planes are c-plane, m-plane, a-plane and r-plane, respectively. The c-plane is a plane which intersects with the c-axis at right angles and a polar plane which has polarity in the c-axis direction. The m- and a-planes are "non-polar planes" that are parallel to the c-axis and the r-plane is a "semi-polar plane". It should be noted that the m-plane is a generic term that collectively refers to a family of (10-10), (–1010), (1-100), (–1100), (01-10) and (0-110) planes.

In general, in a GaN based semiconductor light-emitting element, GaN based semiconductor layers, including an active layer, are stacked one upon the other on a GaN substrate (gallium nitride semiconductor substrate), of which the principal surface is a c-plane. In is generally used in the active layer of the GaN based semiconductor light-emitting element, and the emission wavelength can be extended by increasing its In composition ratio.

If GaN based semiconductor layers, including an active layer, are stacked on a c-plane, an internal electric field will be induced in the active layer due to piezoelectric polarization, because the c-plane is a polar plane. As a result, a quantum Stark effect will be produced to decrease luminous efficiency.

Thus to avoid the influence of the piezoelectric polarization, it has recently been proposed that GaN based semiconductor layers be stacked on an m-plane that is a non-polar plane, instead of a c-plane. FIG. 4A schematically illustrates the crystal structure of a GaN-based semiconductor layer, of which the principal surface is an m-plane, as viewed on a cross section thereof that intersects with the principal surface of the substrate at right angles. The Ga atoms and nitrogen atoms are on the same atomic plane that is parallel to the m-plane. For that reason, no electric polarization will be produced perpendicularly to the m-plane. It should be noted that In and Al atoms that have been added are located at Ga sites to replace Ga atoms. Even when at least some of the Ga atoms are replaced with In and Al atoms, no electric polarization will be produced perpendicularly to the m-plane, either.

The crystal structure of a GaN-based semiconductor, of which the principal surface is a c-plane, as viewed on a cross section thereof that intersects with the principal surface of the substrate at right angles is illustrated schematically in FIG. 4B just for your reference. In this case, Ga atoms and nitrogen atoms are not present on the same atomic plane that is parallel to the c-plane. For this reason, the electric polarization will be produced perpendicularly to the c-plane.

In order to provide a Group III nitride semiconductor light-emitting element which is hardly affected by a piezoelectric field and which has high crystal quality, Japanese Laid-Open Patent Publication No. 2011-23539 discloses a Group III nitride semiconductor light-emitting element which includes: a Group III nitride semiconductor substrate, of which the principal surface defines a finite angle with respect to a reference plane Sc that intersects at right angles with a reference axis Cx extending in the c-axis direction; and an active layer having a quantum well structure which is arranged on the principal surface of the Group III nitride semiconductor substrate and which includes a well layer and barrier layers, each being formed of a Group III nitride semiconductor. In the semiconductor light-emitting element of Japanese Laid-Open Patent Publication No. 2011-23539, the principal surface has a semi-polar property, the active layer has an oxygen concentration of not less than $1 \times 10^{17}$ cm$^{-3}$ and not more than $8 \times 10^{17}$ cm$^{-3}$, and the barrier layers include n-type dopants other than oxygen at a concentration of not less than $1 \times 10^{17}$ cm$^{-3}$ and not more than $1 \times 10^{19}$ cm$^{-}$ in a region near the upper interface which contacts with the lower interface of the well layer closer to the Group III nitride semiconductor substrate.

On the other hand, in order to provide a semiconductor element having excellent luminous efficiency by reducing the influence of the piezoelectric field sufficiently while good crystallinity for the active layer is maintained, Japanese Laid-Open Patent Publication No. 2003-229645 discloses that the quantum well active layer may have a multilayer structure in which a barrier layer undoped region ($In_{0.02}Ga_{0.98}N$ layer), a well layer (undoped $In_{0.2}Ga_{0.8}N$ layer) and a barrier layer n-type region (n-type $In_{0.02}Ga_{0.98}N$ layer) are stacked in this order. According to the disclosure of Japanese Laid-Open Patent Publication No. 2003-229645, the Si concentration in the barrier layer n-type region may be $5 \times 10^{18}$ cm$^{-3}$ or less.

Japanese Laid-Open Patent Publication No. 2000-332364 discloses that by stacking an n-cladding layer, an MQW active layer, and a p-cladding layer on a sapphire substrate and by subjecting the barrier layers of the MQW active layer to gradient doping, a nitride semiconductor element which can reduce significantly the piezoelectric effect to be produced by compressive stress and which has high luminous efficiency can be obtained.

SUMMARY

There is a growing demand for luminous efficiency which is even higher than the one achieved by any of these conventional techniques.

A non-limiting exemplary embodiment of the present application provides a nitride semiconductor light-emitting element having even higher luminous efficiency.

In one general aspect, a nitride semiconductor light-emitting element includes an active layer including a well layer and a barrier layer that is arranged on the well layer. The active layer includes a growing plane which is a non-polar plane. The well layer includes In. The active layer includes an Si-doped layer which is arranged in the well layer, between the well layer and the barrier layer, or in a region of the barrier layer that is located closer to the well layer. A concentration of Si at one interface of the barrier layer on a growing direction side is either zero or lower than a concentration of Si in the Si-doped layer.

According to the above aspect, a nitride semiconductor light-emitting element ensures higher luminous efficiency.

These general and specific aspects may be implemented using a method. Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 1 is a perspective view schematically illustrating a unit cell of GaN.

FIG. 2 is a perspective view showing the four primitive vectors $a_1$, $a_2$, $a_3$ and c of a wurtzite crystal structure.

FIG. 8 is a cross-sectional view schematically illustrating the structure of a gallium nitride-based compound semiconductor light-emitting element according to an embodiment of the present disclosure.

FIG. 9 is a schematic representation showing an exemplary growth sequence to be adopted when an active layer is formed for a gallium nitride-based compound semiconductor light-emitting element according to an embodiment of the present disclosure.

DETAILED DESCRIPTION

Figure 3A:
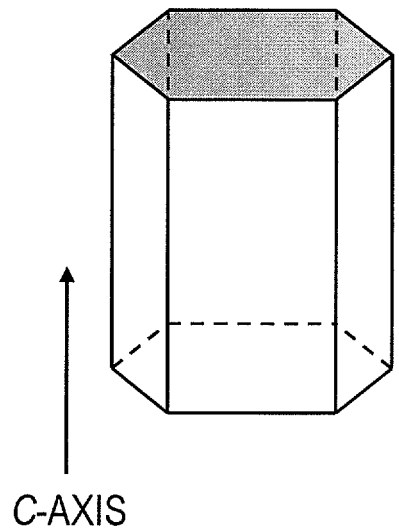
FIGS. 3A through 3D are schematic representations illustrating representative crystal plane orientations of a wurtzite crystal structure.
Figure 3B:
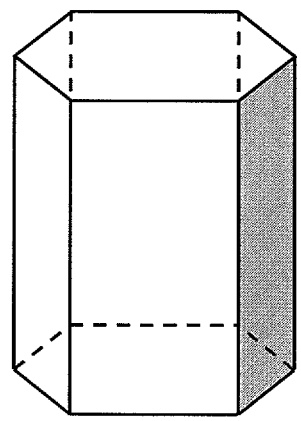
Figure 3C:
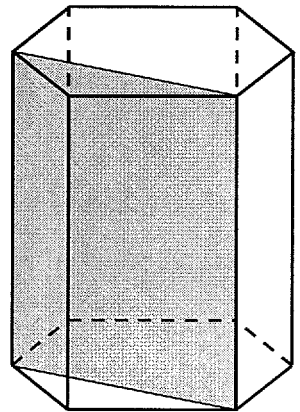
Figure 3D:
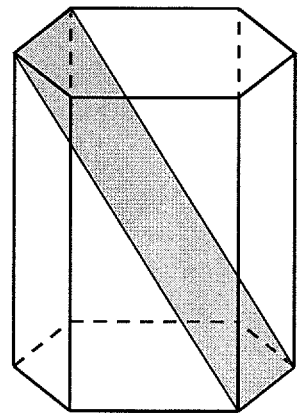
Figure 4A:
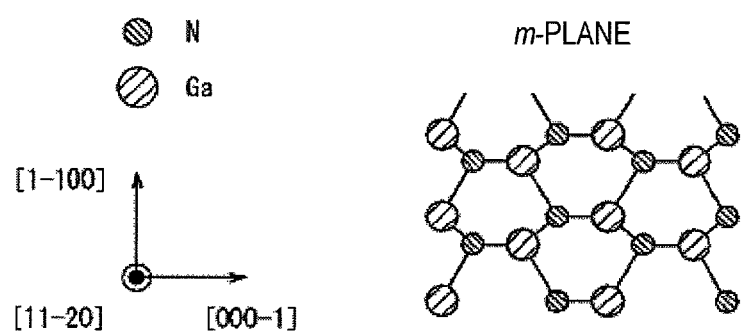
FIG. 4A is a cross-sectional view of an m-plane GaN-based semiconductor and FIG. 4B is a cross-sectional view of a c-plane GaN-based semiconductor.
Figure 4B:
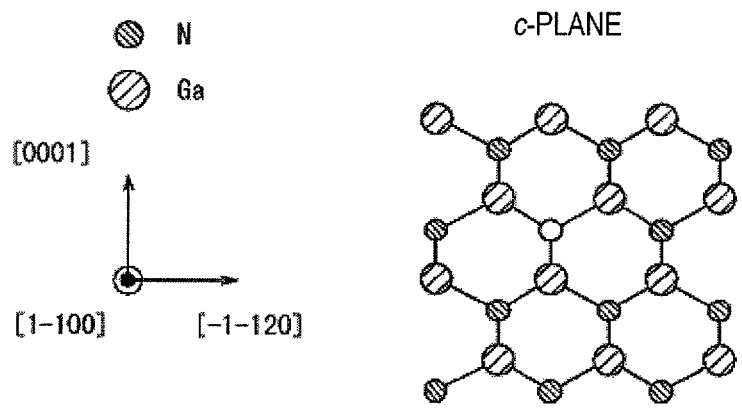

A nitride semiconductor light-emitting element according to an embodiment includes an active layer including a well layer and a barrier layer that is arranged on the well layer. The active layer includes a growing plane which is a non-polar plane. The well layer includes In. The active layer includes an Si-doped layer which is arranged in the well layer, between the well layer and the barrier layer, or in a region of the barrier layer that is located closer to the well layer. An Si concentration at one interface of the barrier layer on a growing direction side is either zero or lower than a concentration of Si in the Si-doped layer.

This configuration increases the luminous efficiency.

The well layer may have a thickness of not less than 3 nm and not more than 20 nm.

The well layer may have an In composition ratio of not less than 5% and not more than 30%.

The maximum and minimum values of the concentration of In as measured in the thickness direction of the well layer may have a difference of 10% or less.

The well layer may be formed of a gallium nitride-based compound semiconductor.

The barrier layer may include an n-type dopant in a region other than the Si-doped layer, and the n-type dopant may be at least one of silicon, oxygen, germanium and tin.

The concentration of Si in the Si-doped layer may be higher than the concentration of the n-type dopant in the barrier layer.

The thickness of the Si-doped layer may be 10% or less of the thickness of the barrier layer.

The concentration of Si in the Si-doped layer may be lower than the concentration of In included in the well layer.

The Si-doped layer may have an Si composition ratio of less than 0.1%.

The Si-doped layer may be arranged in a region of the barrier layer so as to be located closer to the well layer, and the Si-doped layer may be located within a range corresponding to 50% or less of the thickness of the barrier layer as measured from the interface between the barrier layer and the well layer.

The Si-doped layer may have a thickness of not less than 0.3 nm and not more than 0.8 nm.

The thickness of the Si-doped layer may be 50% or less of the thickness of the barrier layer.

The Si-doped layer may be in the well layer, and the concentration of In included in the Si-doped layer may be less than 90% of the concentration of In included in the rest of the well layer other than the Si-doped layer.

The Si-doped layer may divide the well layer into multiple portions each having a thickness of 3 nm or less.

The Si-doped layer may be obtained by doping $Al_aIn_b$-$Ga_cN$ (where $0 \leq a \leq 1$, $0 \leq b < 1$ and $0 < c \leq 1$) with Si.

The well layer may be formed of $Al_xIn_yGa_zK$ (where $0 \leq x < 1$, $0 < y < 1$ and $0 < z < 1$).

The barrier layer may have a thickness of not less than 7 nm and not more than 40 nm.

The active layer may have a multi-quantum well structure.

The active layer may include the well layers and the barrier layers, each of which is provided between two of the well layers.

A normal line to the growing plane of the active layer and a normal line to the m-plane may define an angle of 5 degrees or less.

A light source according to an embodiment may include a nitride semiconductor light-emitting element according to the embodiment described above, and a wavelength changing portion including a phosphor which changes a wavelength of a light emitted from the nitride semiconductor light-emitting element.

A method for fabricating a nitride semiconductor light-emitting element according to an embodiment includes the steps of: forming a well layer, of which the growing plane is a non-polar plane and which includes In; and forming a barrier layer on the well layer so that the growing plane of the barrier layer is also a non-polar plane. The method further includes the step of forming an Si-doped layer by supplying a source including Si after the well layer has been formed and before the barrier layer is formed. An Si concentration at one interface of the barrier layer on a growing direction side is either zero or lower than a concentration of Si in the Si-doped layer.

A method for fabricating a nitride semiconductor light-emitting element according to another embodiment includes the steps of: forming a well layer, of which the growing plane is a non-polar plane and which includes In; and forming a barrier layer on the well layer so that the growing plane of the barrier layer is also a non-polar plane. The step of forming the well layer includes the step of forming an Si-doped layer by supplying a source including at least Si.

The supply of In may be reduced or stopped in the step of forming the Si-doped layer.

A method for fabricating a nitride semiconductor light-emitting element according to still another embodiment includes the steps of: forming a well layer, of which the growing plane is a non-polar plane and which includes In; and forming a barrier layer on the well layer so that the growing plane of the barrier layer is also a non-polar plane. The step of forming the barrier layer includes the step of forming an Si-doped layer in a region of the barrier layer by supplying a source including Si so that the Si-doped layer is located closer to the well layer. An Si concentration at one interface of the barrier layer on a growing direction side is either zero or lower than a concentration of Si in the Si-doped layer.

Hereinafter, the conclusion that the present inventors reached by carrying out experiments will be described.

The present inventors discovered that when a well layer was formed using a non-polar plane as its growing plane, In was introduced into the well layer ranch less efficiently, and therefore, its composition ratio varied far more significantly, than in the case of a c-plane growth, thus resulting in decreased luminous efficiency. Thus, to introduce In more efficiently, reduce the variation in In composition ratio, and eventually increase the luminous efficiency, the present inventors carried out various experiments. As a result of those experiments, the present inventors discovered that by adding silicon (Si) which is a kind of an n-type dopant to the active layer, vaporization or loss of In could be minimized and the variation in In composition ratio could be reduced. Hereinafter, it will be described in detail exactly how the present inventors carried out those experiments and what the results were.

The source gases of In and Ga, which are Group III elements to form part of an InGaN layer, were supplied into a growing furnace intermittently at certain intervals and independently. By performing this process step a number of times, an InGaN layer was grown to an intended thickness on a GaN substrate, of which the principal surface was a non-polar plane and which was arranged in the growing furnace. A trimethylindium (TMI) gas and a trimethylgallium (TMG) gas were used as the In and Ga source gases, respectively. An ammonia ($NH_3$) gas was used as the source gas of nitrogen, which is a Group V element to form part of the InGaN layer. And the $NH_3$ gas was supplied continuously into the growing furnace during the growth of the InGaN layer. Furthermore, a silane ($SiH_4$) gas was used as an Si source gas. In each of a period in which only the TMI gas was supplied (which will be referred to herein as "Period A") and a period in which only the TMG gas was supplied (which will be referred to herein as "Period B"), the $SiH_4$ gas was supplied along with the TMI or TMG gas into the growing furnace intermittently. In the following description, an InGaN layer that was grown by supplying $SiH_4$ during Period A will be referred to herein as "Sample A" and an InGaN layer that was grown by supplying $SiH_4$ during Period B will be referred to herein as "Sample B". These Samples A and B were made under quite the same condition except that the $SiH_4$ gas was supplied into the growing furnace during Periods A and B, respectively. Meanwhile, another InGaN layer was grown as a reference sample with no $SiH_4$ supplied during any of these Periods A and B. The reference sample was also made under quite the same condition as Samples A and B except that no $SiH_4$ was supplied into the growing furnace. The emission wavelengths of these Samples A and B and the reference sample were estimated by measuring their photoluminescence in a room temperature atmosphere.

Figure 5:
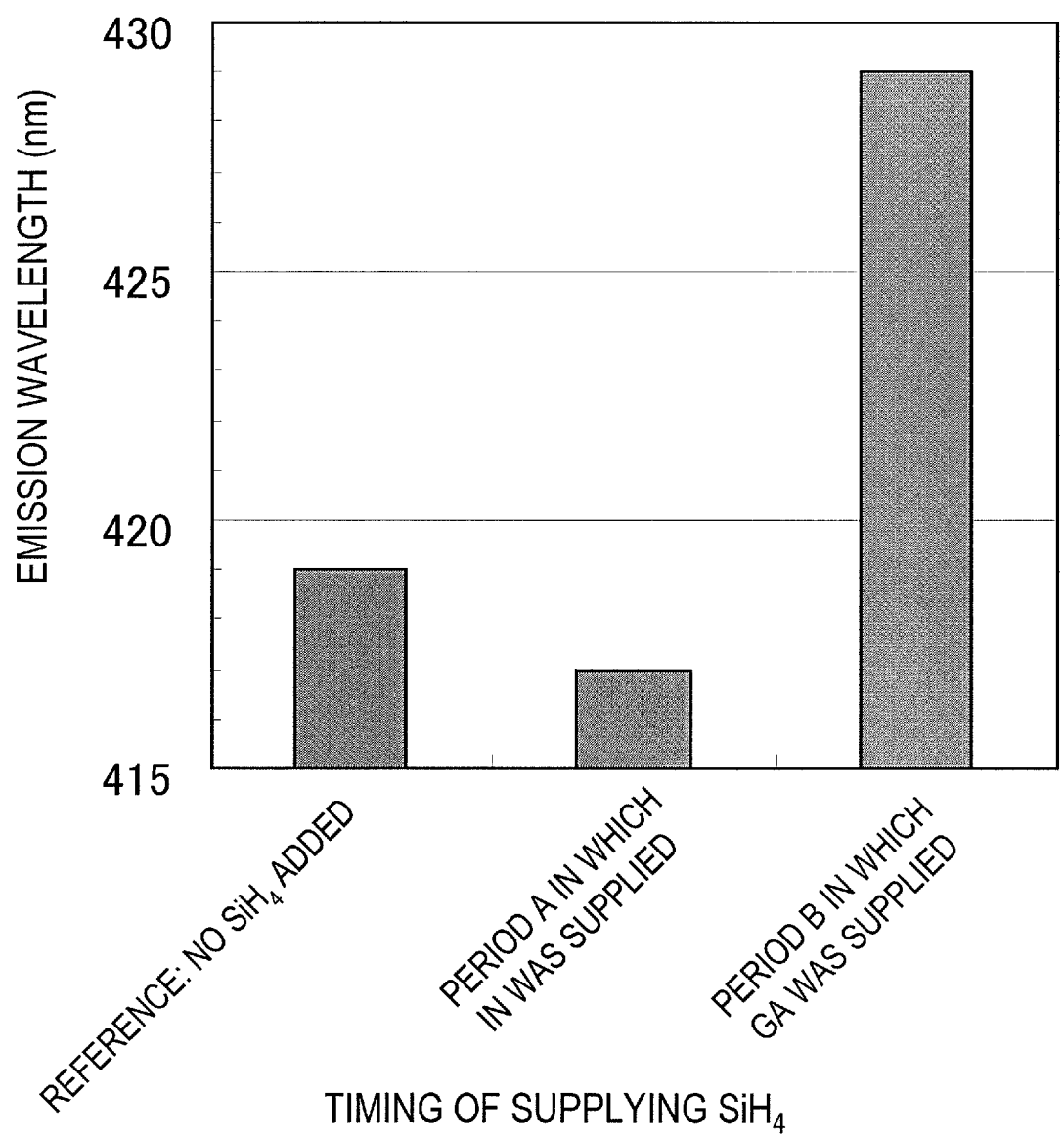
FIG. 5 shows a correlation between the wavelength of an active layer formed by supplying TMI and TMG were supplied independently and the periods in which $SiH_4$ was added in an embodiment of the present disclosure.

FIG. 5 shows the emission wavelengths of Samples A and B that were estimated by measuring their photoluminescence. Also shown in FIG. 5 for the purpose of comparison is the emission wavelength of a reference sample to which no $SiH_4$ was supplied. These results reveal that by supplying $SiH_4$ in Period B in which only Ga was supplied, the emission wavelength of the InGaN layer became a longer one. Specifically, the emission wavelength became approximately 10 nm longer than that of the reference sample to which no $SiH_4$ was supplied. On the other hand, it also turned out that if $SiH_4$ was supplied in Period A in which only In was supplied, the emission wavelength became approximately 2 nm shorter than that of the reference sample to the contrary.

Based on these results, the present inventors discovered that by adding $SiH_4$ as an Si source while Ga was being supplied, it was possible to prevent In, which had been introduced onto the surface of an InGaN layer growing on the principal surface of a substrate that was a non-polar plane, from vaporizing and being lost, i.e., to introduce In into the InGaN layer more efficiently. The present inventors also discovered that if $SiH_4$ as an Si source was added while In was being supplied and while an InGaN layer was growing on the non-polar plane of the substrate, sometimes the wavelength shortened and the In-introduction efficiency decreased. It is not quite clear at this time exactly how such an addition of Si would increase the In-introduction efficiency effectively. However, the vaporization and toss of in from the InGaN layer should probably be reduced due to relaxation of the strain at the interface of the growing layer through the addition of Si. As for an InGaN layer to grow on a substrate of which the principal surface is a polar plane such as a c-plane, its In-introduction efficiency is so high that it is not clear whether or not such an effect can be achieved by adding Si. As for a non-polar plane such as an m-plane, on the other hand, a significant effect was achieved by adding Si probably due to its low In-introduction efficiency.

Japanese Laic-Open Patent Publication No. 2011-23539 says "in a Group III nitride semiconductor light-emitting element according to the present disclosure, the barrier layer of its active layer includes an n-type dopant other than oxygen at a concentration of $1 \times 10^{17}$ cm$^{-3}$ or more in its interface neighboring region that contacts with the interface of the well layer closer to the Group III nitride semiconductor substrate. As a result, the morphology of the barrier layer improves, and therefore, the morphology of the well layer to grow epitaxially on the interface neighboring region so as to contact with the interface neighboring region improves, too, and eventually the crystal quality of the overall active layer improves". However, even if the doping level of Si is increased locally with respect to a region of the barrier layer in the vicinity of the interface of the well layer closer to the substrate, the In-introduction efficiency would not increase. To the contrary, if SiH$_4$ that was added while the barrier layer was growing remains when the InGaN well layer start to grow, the In-introduction efficiency could rather decrease.

Furthermore, Japanese Laid-Open Patent Publication No. 2011-23539 also says "in a Group III nitride semiconductor light-emitting element according to the present disclosure, the plurality of barrier layers preferably includes an n-type dopant other than oxygen at a concentration of not less than $1 \times 10^{17}$ cm$^{-1}$ and not more than $1 \times 10^{19}$ cm$^{-1}$ in the interface neighboring region that contacts with the interface of the well layer. As a result, each of those barrier layers includes an n-type dopant other than oxygen at a concentration of not less than $1 \times 10^{17}$ cm$^{-3}$ and not more than $1 \times 10^{19}$ cm$^{-3}$ in the entire interface neighboring region that contacts with the interface of the well layer. As a result, as the morphology of the barrier layers further improves, the morphology of each of those layers that form the active layer further improves, too. Consequently, the crystal quality of the element further improves". However, if the Si doping level were increased with respect to the barrier layers on the entire interface with the well layer, the In-introduction efficiency could rather decrease as described above due to the influence of the remaining Si at the interface of the well layer closer to the substrate. That is why in the structure of Japanese Laid-Open Patent Publication No. 2011-23539, the In composition in the well layer could have a non-uniform distribution in the thickness direction.

On the other hand, "in order to provide a semiconductor element with excellent luminous efficiency by eliminating sufficiently the influence of a piezoelectric field while the crystallinity of the active layer is kept as good as possible", Japanese Laid-Open Patent Publication No. 2003-229645 discloses a "quantum well structure in which the barrier layer includes an n-type region doped with an n-type dopant and an undoped region, the n-type region has a dopant concentration of $5 \times 10^{18}$ cm$^{-3}$ or less, a well layer has been formed on the undoped region, and the n-type region has been formed on the well layer".

Meanwhile, "in order to provide a GaN-based semiconductor element which can reduce the effect of a piezoelectric field significantly and which has high luminous efficiency", Japanese Laid-open Patent Publication No. 2000-332364 discloses a "nitride semiconductor element which includes an active layer and a pair of cladding layers that sandwich the active layer between them, in which the top surface of the nitride semiconductor crystals is a nitrogen surface, and in which an n-type dopant has been added to the barrier layer of the multi-quantum well active layer of the nitride semiconductor element so that the concentration of the n-type dopant becomes higher in a region closer to the n-cladding layer than in a region closer to the other cladding layer".

According to the subject matters of Japanese Laid-Open Patent Publications No. 2003-229645 and No. 2000-332354, crystals are supposed to grow on a polar plane, and the problem to be overcome by them is to reduce the piezoelectric field generated by the polar plane. On the other hand, according to an embodiment of the present disclosure, crystals are supposed to grow on a non-polar plane that is not affected by the piezoelectric field. That is why the problem to be overcome by the subject matters of Japanese Laid-Open Patent Publications No. 2003-229645 and No. 2000-332364 has nothing to do with the present disclosure. Also, if the growing plane is a polar plane, the In-introduction efficiency should be high while the InGaN active layer is being formed. For that reason, the problem to be overcome by the present disclosure has nothing to with the subject matters of Japanese Laid-Open Patent Publications No. 2003-229645 and No. 2000-332364. That is to say, the subject matters of Japanese Laid-open Patent Publications No. 2003-229645 and No. 2000-332364 and the embodiment of the present disclosure have essentially different problems to overcome.

Figure 6:
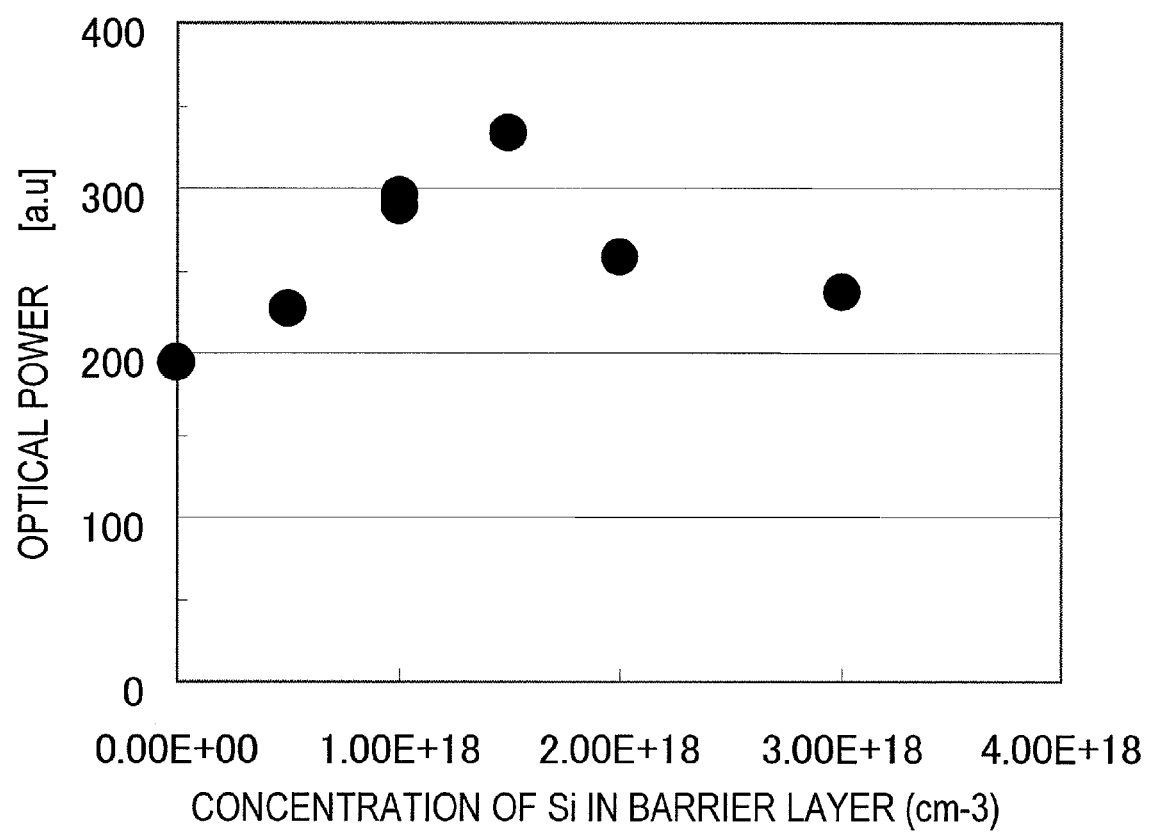
FIG. 6 shows a relation between the emission intensity of a light-emitting element, of which the principal surface is a non-polar plane, and the Si doping level with respect to a barrier layer.

The present inventors carried out experiments on the Si doping level with respect to the barrier layer. As a result, we made the following discovery. FIG. 6 shows how the emission intensity of a light-emitting element, of which the principal surface was a non-polar plane, changed with the Si doping level with respect to the barrier layer. The Si doping process was carried out by adding an SiH$_4$ gas while the barrier layer was growing. The barrier layer was grown so as to have a uniform Si dopant concentration. The respective sample light-emitting elements under evaluation were supposed to have the same structure except the Si dopant concentration in the barrier layer. As can be seen from FIG. 6, if the Si doping level with respect to the barrier layer was $1.5 \times 10^{18}$ cm$^{-3}$ or less, the emission intensity increased as the concentration rose. It can also be seen that once the Si doping level with respect to the barrier layer exceeded $1.5 \times 10^{18}$ cm$^{-3}$, the emission intensity decreased. That is why if the Si concentration in the entire barrier layer is optimized, the light emission characteristic can be improved to a certain degree. However, the light emission characteristic still needs to be improved. Furthermore, if the barrier layer were heavily doped with Si, the crystallinity of the barrier layer would decrease, so would the crystallinity of the InGaN well layer to be formed on the barrier layer.

Thus, the present inventors carried out researches more intensively. As a result, the present inventors discovered that in order to prevent In atoms from vaporizing or being lost from the well layer, it would be particularly effective to form an Si heavily doped layer right after an InGaN well layer has been formed in a quantum well structure in which well layers and barrier layers are stacked one upon the other repeatedly and periodically. By adopting such a structure, the In composition can be increased parallel to the growing plane and in the thickness direction, and the emission wavelength of the light-emitting element can be a longer one. In this case, if the thickness of the Si-doped layer is set to fail within an appropriate range, a decrease in the crystallinity of the barrier layer and well layer to be formed on the Si-doped layer can be reduced with In atoms prevented from vaporizing or being lost from the well layer that has been formed under the Si-doped layer. As a result, the internal quantum efficiency and emission intensity can be increased.

The present inventors discovered via experiments that by setting the thickness of the Si-doped layer to be as large as that of one atomic layer or 0.3 nm, vaporization or loss of In atoms from the well layer that had been formed under the Si-doped layer could be further reduced. Furthermore, by setting the thickness of the Si-doped layer to be 10% or less of the thickness of the barrier layer, the decrease in the crystallinity of the barrier layer and well layer that had been formed on the Si-doped layer could be further prevented.

Furthermore, even if the Si-doped layer is not formed right after the InGaN well layer has been formed but if an InGaN well layer is formed in a region of the barrier layer closer to the InGaN well layer, vaporization or loss of In atoms from the well layer can also be reduced. Also, even if the Si-doped layer is formed in the well layer, vaporization or loss of In atoms from the well layer can also be reduced.

Moreover, even if a dopant exhibiting n-type or p-type conductivity such as Si or Mg is included in the barrier layer, the effect described above can also be achieved. The same can be said about a nitride semiconductor light-emitting element other than the GaN-based semiconductor light-emitting element.

(Embodiment 1)

Hereinafter, a nitride semiconductor light-emitting element as a first embodiment will be described with reference to FIG. 7.

Figure 7A:
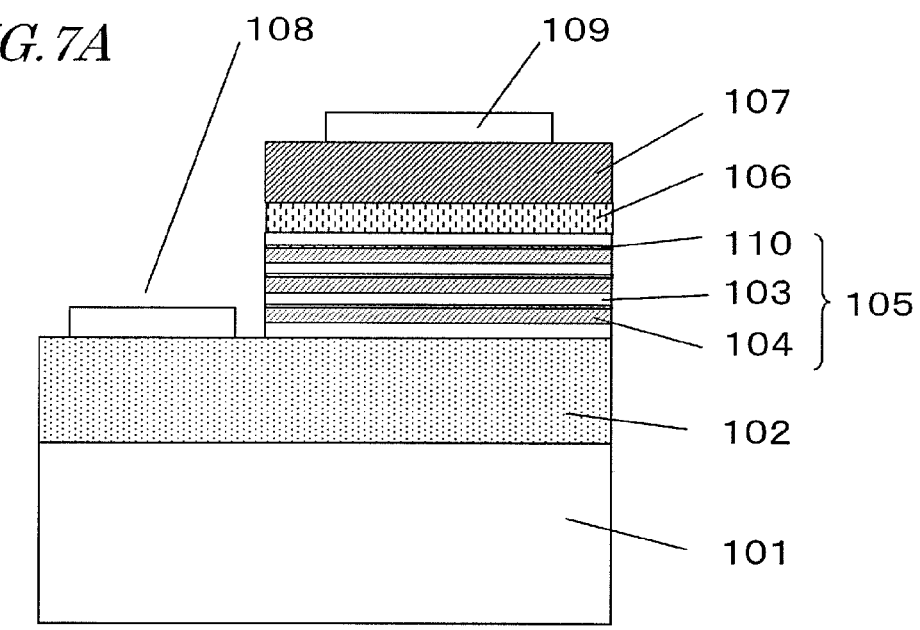
FIGS. 7A and 7B are cross-sectional views schematically illustrating the respective structures of a gallium nitride-based compound semiconductor light-emitting element and a multi-quantum well active layer according to an embodiment of the present disclosure, respectively.

As shown in FIG. 7A, the nitride semiconductor light-emitting element of this embodiment includes a GaN/InGaN multi-quantum well active layer 105, of which the growing plane is a non-polar plane. The GaN/InGaN multi-quantum well active layer 105 includes a number of $In_yGa_{1-y}N$ (where $0<y<1$) well layers 104, each including In, and a number of GaN barrier layers 103, each of which is arranged on an associated one of the $In_yGa_{1-y}N$ (where $0<y<1$) well layers 104.

In FIG. 7A, the $In_yGa_{1-y}N$ (where $0<y<1$) well layers 104 and the GaN barrier layers 103 are alternately stacked one upon the other.

Figure 7B:
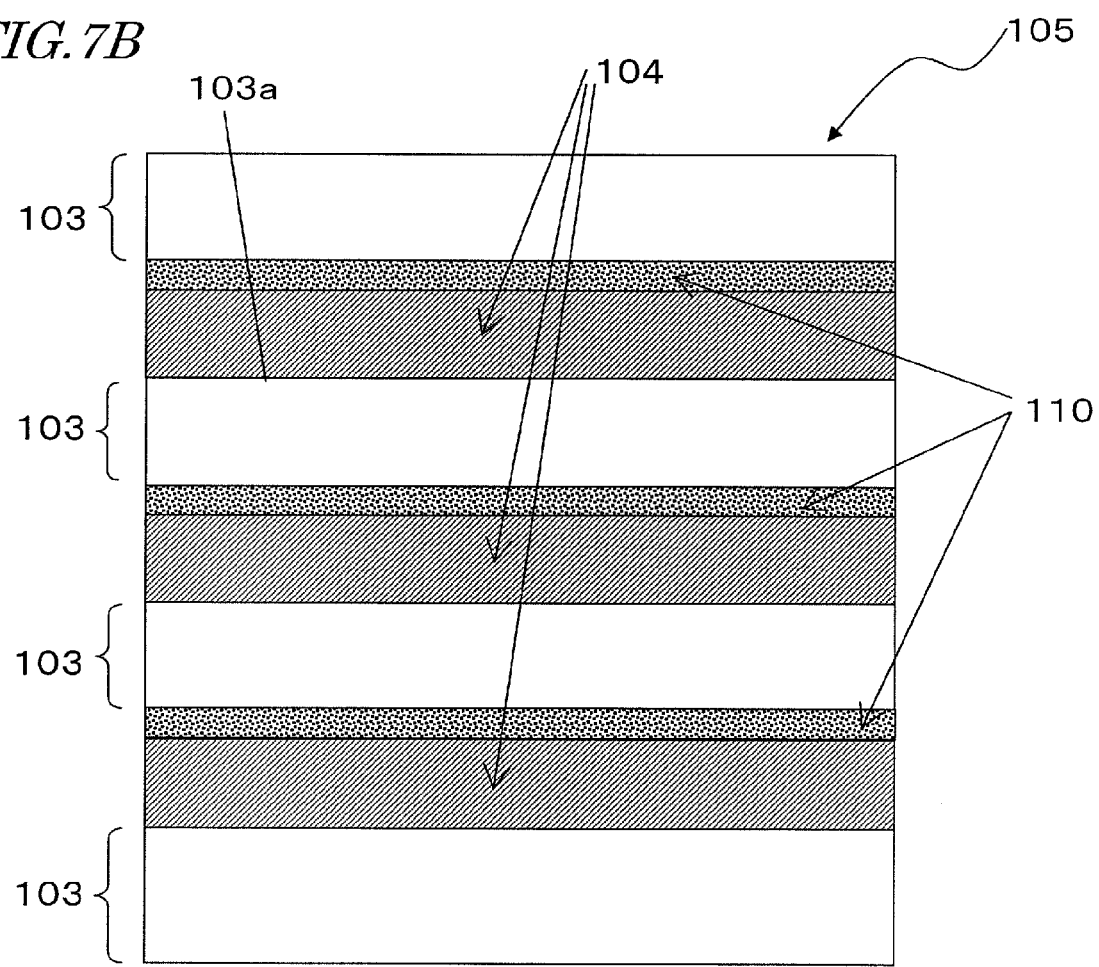

As shown in FIG. 7B, an Si-doped layer 110 may be arranged between each pair of $In_yGa_{1-y}N$ (where $0<y<1$) well layer 104 and GaN barrier layer 103, for example.

Alternatively, an Si-doped layer 110 may also be arranged in a region of its associated GaN barrier layer 103 closer to its associated $In_yGa_{1-y}N$ (where $0<y<1$) well layer 104 as shown in FIG. 8. In this description, the "region of a GaN barrier layer 103 closer to its associated $In_yGa_{1-y}N$ (where $0<y<1$) well layer 104" refers herein to a region of the GaN barrier layer 103 which is located at a distance from the interface with the $In_yGa_{1-y}N$ (where $0<y<1$) well layer 104 that is at most 50% as long as the thickness of the GaN barrier layer 103.

In the following description of this embodiment, the interface of each GaN barrier layer 103 closer to the p-side electrode 109 will be referred to herein as a "interface on the growing direction side 103a". The Si concentration at the interface on the growing direction side 103a of the GaN barrier layer 103 is either zero or lower than the Si concentration in the Si-doped layer 110. Even if Si is not supplied intentionally to the interface on the growing direction side 103a of the GaN barrier layer 103, Si still could enter that interface from other regions. Also, depending on the method of measuring the Si concentration, Si could be observed at the interface on the growing direction side 103a of the GaN barrier layer 103. In that case, the Si concentration at the interface on the growing direction side 103a of the GaN barrier layer 103 may be $10^{15}$ cm$^{-3}$ or less, for example.

The Si-doped layer 110 may have an Si composition ratio of 0.0001% or more but less than 0.1%, for example. If the Si composition ratio is 0.0001% or more, vaporization or loss of In atoms from the well layer can be reduced effectively. Also, if the Si composition ratio is less than 0.1%, generation of defects in the GaN barrier layer can be reduced.

The Si concentration in the Si-doped layer 110 may be lower than the In concentration in the $In_yGa_{1-y}N$ (where $0<y<1$) well layer 104. The present inventors observed via experiments that even suet an Si-doped layer, of which the Si concentration was lower than the In concentration, could also prevent In atoms from vaporizing and being lost from the well layer due to the relaxation of the strain on the interface of the well layer.

According to this embodiment, by forming the Si-doped layer 110, the difference between the maximum and minimum In concentrations in the $In_yGa_{1-y}N$ (where $0<y<1$) well layer 104 as measured in the thickness direction can be reduced to 10% or less.

Hereinafter, it will be described how to fabricate the nitride semiconductor light-emitting element of this embodiment.

A crystal growing substrate 101 used in this embodiment was an m-plane GaN substrate, of which the growing plane is a non-polar plane. As the substrate 101, an m-plane SiC substrate, of which the surface is covered with an m-plane GaN layer, or an r-plane or m-plane sapphire substrate, of which the surface is covered with an m-plane GaN layer may be used. The point is that the active layer be an m-plane nitride-based semiconductor layer.

According to the present disclosure, the "m-plane" may be a plane that tilts in a predetermined direction and defines a tilt angle of ±5 degrees or less with respect to an m-plane that is not tilted. The growing plane of an actual m-plane semiconductor layer does not always have to be perfectly parallel to an m-plane but may define a predetermined tilt angle with respect to the m-plane. The tilt angle is defined by the angle that is formed between a normal line to the principal surface of the active layer and a normal line to the m-plane. The absolute value of the tilt angle θ may be 5 degrees or less, and is suitably 1 degree or less, in the c-axis direction, and may be 5 degrees or less, and is suitably 1 degree or less, in the a-axis direction, too. Although the "m-plane" is tilted overall with respect to the ideal m-plane, the former plane actually consists of a number of steps, each of which is as thick as one to several atomic layers, and includes a huge number of m-plane regions, speaking microscopically. That is why planes that are tilted at an angle of 5 degrees or less (which is the absolute value) with respect to an m-plane would have similar properties to those of the m-plane.

However, if the absolute value of the tilt angle θ is more than 5 degrees, the internal quantum efficiency could decrease due to the piezoelectric field as described above. Nevertheless, even if the tilt angle θ is set to be 5 degrees, tor example, the actual tilt angle θ could be different from 5 degrees by approximately ±1 degree due to some variation involved with the manufacturing process. It is difficult to totally eliminate such a manufacturing process induced variation and such a small angular difference as this would not diminish the effect of embodiments of the present disclosure. Likewise, any non-polar plane other than an m-plane also includes planes that define a tilt angle of ±5 degrees or less with respect to that non-polar plane.

The gallium nitride-based compound semiconductor layers to form the GaN/InGaN multi-quantum well active layer 105 and other layers were deposited by an MOCVD (metalorganic chemical vapor deposition) method. First of all, before crystals start to be grown, the substrate 101 is washed using a buffered hydrofluoric acid (BHF) solution, rinsed with water, and then dried sufficiently. The substrate 101 that has been washed in this manner is loaded into the reaction chamber of an MOCVD system without being exposed to the air as successfully as possible. Thereafter, while only ammonia ($NH_3$) gas is supplied as a nitrogen source gas, the substrate is heated to approximately 850 degrees Celsius to clean the surface of the substrate.

Next, while a trimethylgallium (TMG) gas or a triethylgallium (TEG) gas and a silane ($SiH_4$) gas is supplied, the substrate is heated to about 1100 degrees Celsius to deposit an n-GaN layer 102. The silane gas is the source gas of Si as an n-type dopant.

Next, the supply of the $SiH_4$ gas is stopped and the temperature of the substrate is lowered to less than 800 degrees Celsius to form a GaN barrier layer 103. In addition, a trimethylindium (TMI) gas also starts to be supplied to deposit an $In_yGa_{1-y}N$ (where $0<y<1$) well layer 104, which is formed of a gallium nitride-based compound semiconductor.

In this embodiment, by alternately depositing the GaN barrier layers 103 and $In_yGa_{1-y}N$ (where $0<y<1$) well layers 104 in two or more cycles, a GaN/InGaN multi-quantum well active layer 105 that will emit light is formed. In this case, these layers are formed in two or more cycles, because the larger the number of the $In_yGa_{1-y}N$ (where $0<y<1$) well layers 104, the more perfectly an excessive increase in the carrier density in the well layer can be avoided when the device is driven with a large current, the more significantly the number of carriers overflowing out of the active layer can be reduced, and eventually the better the performance of the element can be. Alternatively, a single active layer may also include only one $In_yGa_{1-y}N$ (where $0<y<1$) well layer 104 which is sandwiched between two GaN barrier layers 103. Still alternatively, an $In_yGa_{1-y}N$ (where $0<y<1$) well layer 104 may be formed directly on the n-GaN layer 102, and a GaN barrier layer 103 may be formed on the $In_yGa_{1-y}N$ (where $0<y<1$) well layer 104. In that case, only one $In_yGa_{1-y}N$ (where $0<y<1$) well layer 104 and only one GaN barrier layer 103 may be provided.

The $In_yGa_{1-y}N$ (where $0<y<1$) well layer 104 is suitably deposited by adjusting the growing time so that the layer will have a thickness of not less than 3 nm and not more than 20 nm. If the $In_yGa_{1-y}N$ (where $0<y<1$) well layer 104 has a thickness of 3 nm or more, the segregation of In to be caused by adopting the method of this embodiment can be reduced effectively. In addition, since the influence of the piezoelectric field can be reduced by the m-plane growth, the thickness of the well layer can be set to be 6 nm or more. As a result, a droop in luminous efficiency can be reduced. Furthermore, if the well layer has a thickness of 20 nm or less, the overall size of the element does not become too large.

On the other hand, the GaN barrier layer 103 to separate the $In_yGa_{1-y}N$ (where $0<y<1$) well layer 104 may be deposited by adjusting the growing time so that the layer will have a thickness of not less than 6 nm an not more than 40 nm. If the GaN barrier layer 103 has a thickness of 6 nm or more, a barrier against the $In_yGa_{1-y}N$ (where $0<y<1$) well layer 104 can be formed with more certainty. Also, if the barrier layer 103 has a thickness of 40 nm or less, the overall size of the element does not become too large.

The In composition ratio in the $In_yGa_{1-y}N$ (where $0<y<1$) well layer 104 may fall within the range of not less than 5% and not more than 30%. If the In composition ratio is 5% or more, the decrease in the In-introduction efficiency to be caused by adopting the method of this embodiment can be prevented effectively. On the other hand, if the In composition ratio is 30% or less, vaporization or loss of In atoms from the well layer of a light-emitting element that operates in a longer wavelength range can be reduced.

In this embodiment, an Si-doped layer 110 is formed in the vicinity of the interface between each well layer 104 and its associated GaN barrier layer 103 by the method to be described in detail later.

Hereinafter, an exemplary process for forming the GaN/InGaN multi-quantum well active layer 105 shown in FIGS. 7A and 7B will be described with reference to FIG. 9, which shows a cross-sectional structure of the GaN/InGaN multi-quantum well active layer 105 to be formed in this embodiment and an example of a source gas supply sequence while the active layer is being formed. In the example illustrated in FIG. 9, three GaN barrier layers 103 and two $In_yGa_{1-y}N$ (where $0<y<1$) well layers 104 are stacked alternately. These GaN barrier layers 103 and $In_yGa_{1-y}N$ (where $0<y<1$) well layers 104 grow from the left to the right on the paper on which FIG. 9 is drawn and the bold arrow shown in FIG. 9 indicates the "thickness direction".

In this embodiment, the supply of $SiH_4$ is started at a time t1 when the well layer 110 finishes growing and either reduced or stopped at a time t2 before the Si-doped layer 110 becomes as thick as one to three atomic layers. And then the GaN barrier layer 103 is formed. In this manner, the structure shown in FIG. 7B is obtained.

In the meantime, $NH_3$ and trimethylgallium (TMG) gases are also supplied at appropriate flow rates in order to form an Si-doped layer 110 and a GaN barrier layer 103. Alternatively, in forming a GaN barrier layer 103, a trimethylindium (TMI) gas may also be supplied at an appropriate flow rate. In that case, the composition of the barrier layer becomes $In_zGa_{1-z}N$ (where $0<z<1$). The In composition ratio in the barrier layer is smaller than the In composition ratio in the well layer.

It should be noted that in this embodiment, the supply of the $SiH_4$ gas does not always have to be started at the time t1 when the well layer 110 finishes growing. Alternatively, the Si-doped layer 110 may also be formed by starting to supply the $SiH_4$ gas when a certain period of time passes since the GaN barrier layer 103 started to grow. In that case, the Si-doped layer 110 will be located in the GaN barrier layer 103 as shown in FIG. 8.

In the example described above, the supply rate of the $SiH_4$ gas is supposed to be adjusted in order to control the Si concentration in the Si-doped layer 110. However, the Si concentration may also be controlled by any other method, e.g., by decreasing the supply rate of the $NH_3$ or TMI gas or by changing the growing temperature. Although the Si-doped layer 110 is illustrated as a definite "layer" in FIG. 8, the Si concentration does not have to change stepwise at the interface of the Si-doped layer 110. As long as there is a portion having a locally increased Si concentration in the vicinity of the interface of the GaN barrier layer 103 and if that portion runs parallel in the in-plane direction, then that portion is the "Si-doped layer 110".

When the Si-doped layer 110 deposited becomes as thick as one to three atomic layers (i.e., is deposited to a thickness of not less than 0.3 nm and not more than 0.8 nm), the supply of the SiH$_4$ gas is either reduced or stopped at a time t2. If the flow rate of the SiH$_4$ gas is reduced, the supply of the SiH$_4$ gas will foe stopped by a time t3 when the GaN barrier layer 103 finishes being formed. After that, by supplying NH$_3$, TMI and IMG gases from the time t3 through a time t4, an In$_y$Ga$_{1-y}$N (where 0<y<1) well layer 104 can be deposited to an intended thickness.

By performing such a process step a number of times, an In$_y$Ga$_{1-y}$N (where 0<y<1) well layer 104, an Si-doped layer 110 and a GaN barrier layer 103 are formed in this order. The Si-doped layer 110 is arranged either between the In$_y$Ga$_{1-y}$N (where 0<y<1) well layer 104 and the GaN barrier layer 103 or in a region of the GaN barrier layer 103 closer to the In$_y$Ga$_{1-y}$N (where 0<y<1) well layer 104.

The thickness of the Si-doped layer 110 may be 50% or less of the thickness of the GaN barrier layer 103. In that case, the vaporization or loss of In atoms from the well layer can be avoided due to relaxation of the strain on the interface of the well layer. Furthermore, a decrease in the crystallinity of the barrier layer or generation of defects due to the presence of the thick Si-doped layer can be avoided.

The rest of the GaN barrier layer 103 other than the Si-doped layer 110 may include an n-type dopant, which is at least one selected from the group consisting of silicon, oxygen, germanium, and tin. The n-type dopant included in the rest of the GaN barrier layer 103 other than the Si-doped layer 110 may nave a concentration of not less than $1\times10^{16}$ cm$^{-3}$ and not more than $1\times10^{19}$ cm$^{-3}$, for example. The Si concentration in the Si-doped layer 110 may be higher than the concentration of the n-type dopant included in the rest of the GaN barrier layer 103 other than the Si-doped layer 110. Then, a decrease in the crystallinity of the barrier layer due to heavy Si doping into the barrier layer can be reduced and vaporization or loss of In atoms from the well layer can be reduced even more effectively.

The Si-doped layer 110 may include Al. For example, the Si-doped layer 110 may be obtained by doping an Al$_a$In$_b$Ga$_c$N (where 0≤a≤1, 0≤b<1 and 0<c≤1) layer with Si.

The In$_y$Ga$_{1-y}$N (where 0<y<1) well layer 104 may include Al. For example, the In$_y$Ga$_{1-y}$N (where 0<y<1) well layer 104 may be formed of Al$_x$In$_y$Ga$_z$N (where 0≤x<1, 0<y<1 and 0<z<1).

In this embodiment, the growing condition was adjusted by the method described above so that the emission wavelength would be around 450 nm to form a GaN/InGaN multi-quantum well active layer A (representing a comparative example) in which InGaN well layers, each having a thickness of 6 nm, and GaN barrier layers, each having a thickness of 15 nm, were alternately stacked in three cycles. In addition, another GaN/InGaN multi-quantum well active layer B was separately formed as a specific example of the present disclosure. In the multi-quantum well active layer B, GaN barrier layers, each also having a thickness of 15 nm but including an Si-doped layer having a thickness of 0.8 nm in the vicinity of the interface on the InGaN well layer, and InGaN well layers, each having a thickness of 6 nm, were alternately stacked in three cycles. Specifically, the growing condition included a growing temperature of 750 degrees Celsius, a growing pressure of 300 Torr, a TMG supply flow rate of 33 µmol/min and an NRG supply flow rate of 0.8 mol/min in both cases. These flow rates were kept constant but TMI was supplied at a flow rate of 170 µmol/min only while the InGaN well layer was being deposited.

Figure 10A:
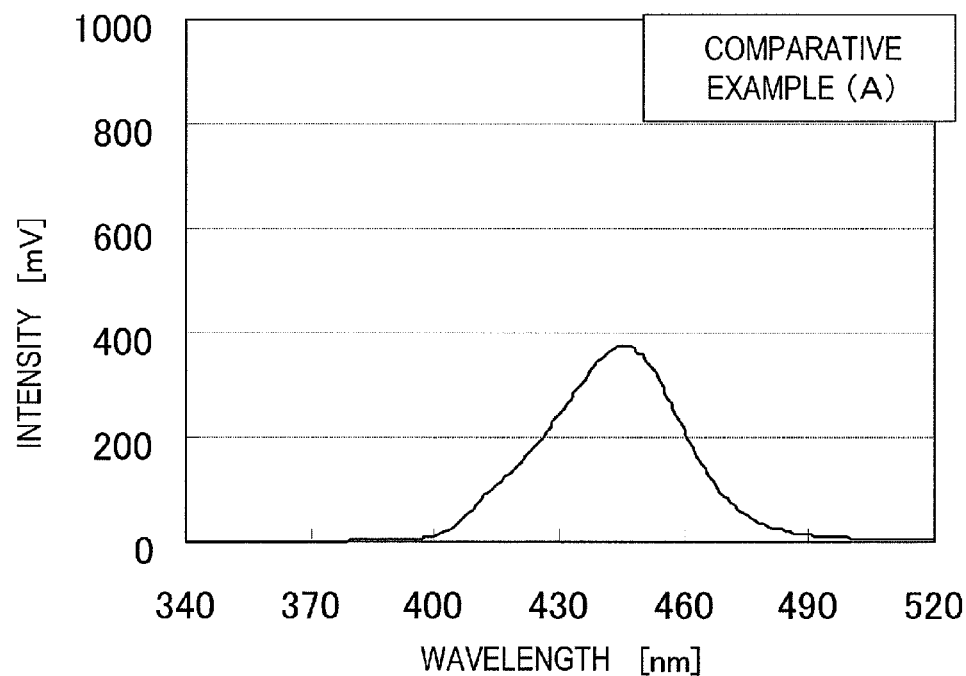
FIG. 10A is a graph showing the photoluminescence of a sample which was made as Comparative Example (A) and FIG. 10B is a graph showing the photoluminescence of a sample which was made as Specific Example (B) in an embodiment of the present disclosure.
Figure 10B:
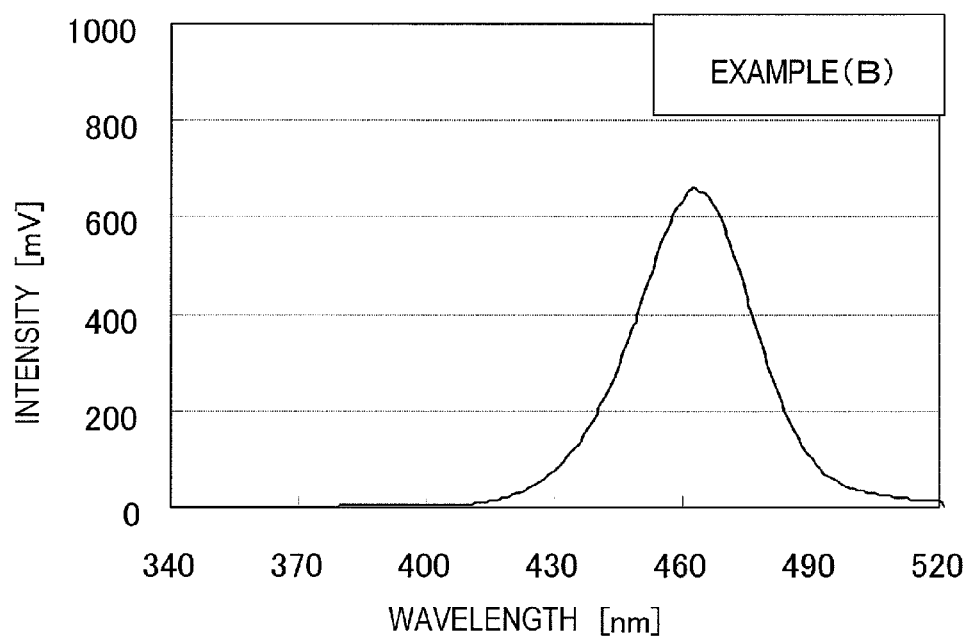

These comparative and specific examples had their photoluminescence (PL) measured. The PL spectra obtained from them are shown in FIG. 10.

The comparative example (A) which was made by the standard method had a peak wavelength of 445 nm, a peak emission intensity of 380 mV, and a spectrum half width of 37 nm. The comparative example (A) came to nave a PL spectrum having a very large half width, of which the intensity reached a peak at a particular wavelength and reached another peak at a shorter wavelength than the particular one. This result suggests that it would be difficult to control the emission wavelength of the InGaN well layer having a thickness of 6 nm.

On the other hand, the specific example (B) in which the Si-doped layer was inserted into the well layer had a peak wavelength of 463 nm, a peak emission intensity of 660 mV, and a spectrum half width of 32 nm. In the specific example (B), the wavelength was about 20 nm longer than in the specific example (A), which indicates that the In composition increased in the well layer. The emission intensity nearly doubled. In addition, the double peaks disappeared, a single-peak spectrum was obtained instead, and the half width also decreased by approximately 5 nm. This is a result indicating that the uniformity in the In composition in the in-plane and thickness directions increased in the In$_y$Ga$_{1-y}$N (where 0<y<1) well layer 104. According to this embodiment, it is possible to prevent the emission spectrum from becoming too broad and to increase the yield of the emission wavelength.

Figure 11:
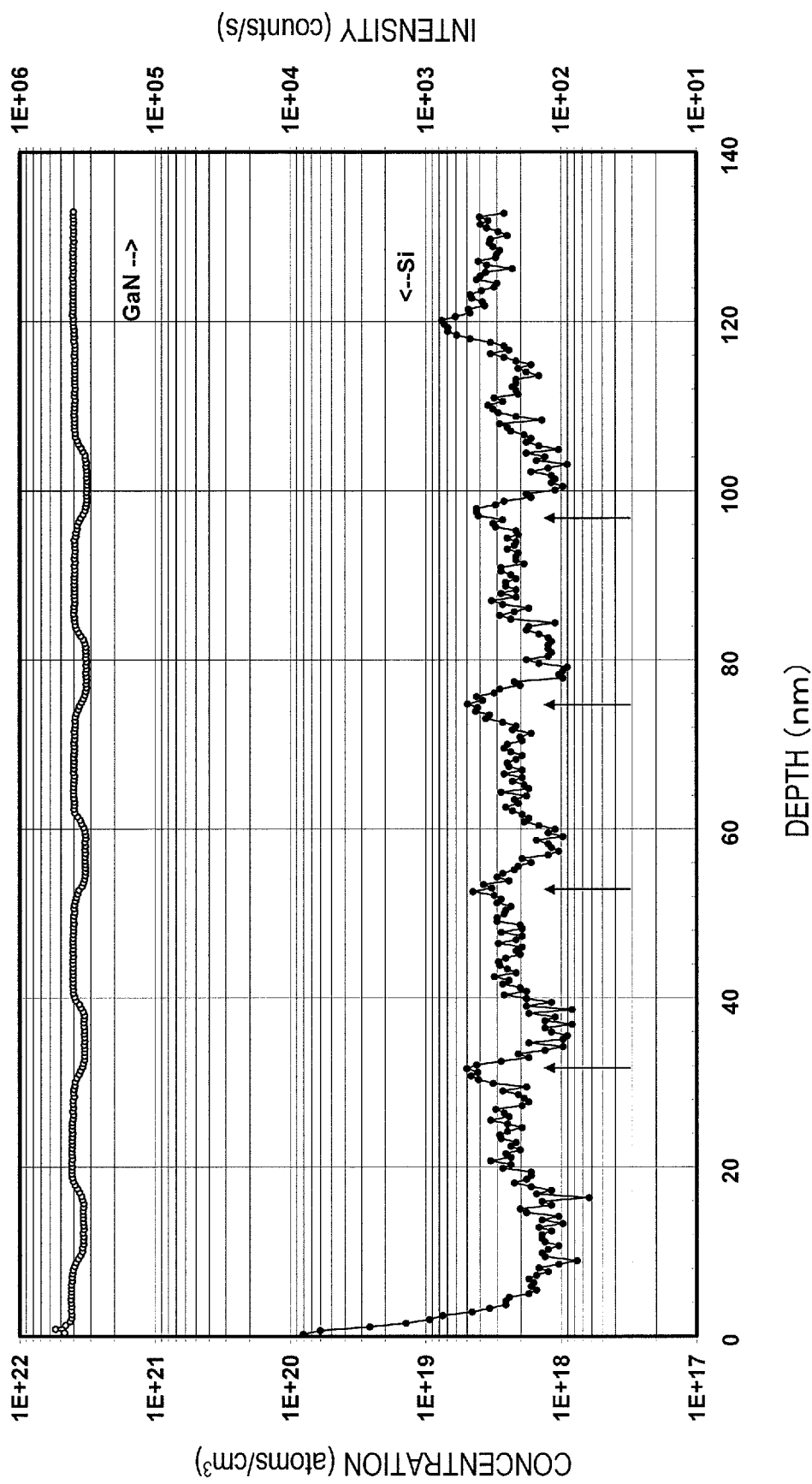
FIG. 11 is a graph showing the results of analysis of a secondary ion-microprobe mass spectrometry (SIMS) which was carried out on a sample that had been prepared according to an embodiment of the present disclosure.

The sample obtained as this specific example (B) had its Si concentration distribution evaluated in the depth direction by secondary ion-microprobe mass spectrometry (SIMS). FIG. 11 shows the SIMS profile thus obtained. In this case, not only Si but also GaN molecules were used as elements under measurement. As can be seen from FIG. 11, an Si-doped layer having an Si peak concentration of approximately $5\times10^{18}$ cm$^{-1}$ was formed between the well layer and the barrier layer. However, due to the resolution of measurement of the SIMS (approximately 1 nm) and the knocking effect, the Si-doped layer was observed as if the Si-doped layer was thicker than the actual one and had reached a region of the well layer. Also, in the depth direction distribution of GaN molecules, a region in which the GaN concentration decreased by the In composition corresponds to the InGaN well layer. It can be seen from this depth direction distribution that the In composition had a uniform distribution in the depth direction in the well layer.

As can be seen, according to an embodiment of the present disclosure, it does contribute very effectively to reducing the In composition fluctuation in the in-plane and thickness directions of the In$_y$Ga$_{1-y}$N (where 0<y<1) well layer 104 to form an Si-doped layer either between the In$_y$Ga$_{1-y}$N (where 0<y<1) well layer 104 and the barrier layer 103 or in a region of the barrier layer 103 closer to (the interface with) the well layer 104.

Now take a look at FIG. 7 again.

After the GaN/InGaN multi-quantum well active layer 105 has been deposited, the supply of the TMI gas is stopped and the hydrogen gas starts to be supplied again as a carrier gas, in addition to the nitrogen gas. Furthermore, the growing temperature is raised to the range of 850-1000 degrees Celsius, and trimethylaluminum (TMA) and bis(cyclopentadienyl) magnesium (Cp$_2$Mg), which is a source gas of Mg as a p-type dopant, are supplied to form a p-AlGaN overflow suppressing layer 106. Next, the supply of the TMA gas is stopped to deposit a p-GaN layer 107.

Thereafter, the substrate is unloaded from the reaction chamber and only predetermined portions of the p-GaN layer 107, p-AlGaN overflow suppressing layer 106 and GaN/InGaN multi-quantum well active layer 105 are removed by performing photolithography and etching processes, for example, to expose a portion of the n-GaN layer 102. On the exposed region of the n-GaN layer 102, an n-side electrode 108 consisting of Ti/Al layers is formed. On the other hand, a p-side electrode 109 may consist of Pd/Pt layers, for example.

By performing these process steps, n-type carriers and p-type carriers can be injected, and a light-emitting element, of which the GaN/InGaN multi-quantum well active layer 105 fabricated by the method of this embodiment can emit light at an intended wavelength, can be obtained.

(Embodiment 2)

Hereinafter, a nitride semiconductor light-emitting element as a second embodiment will be described with reference to FIG. 12. In the following description of the second embodiment, the same feature as what has already been described for the first embodiment will not be described all over again as a matter of principle.

Figure 12A:
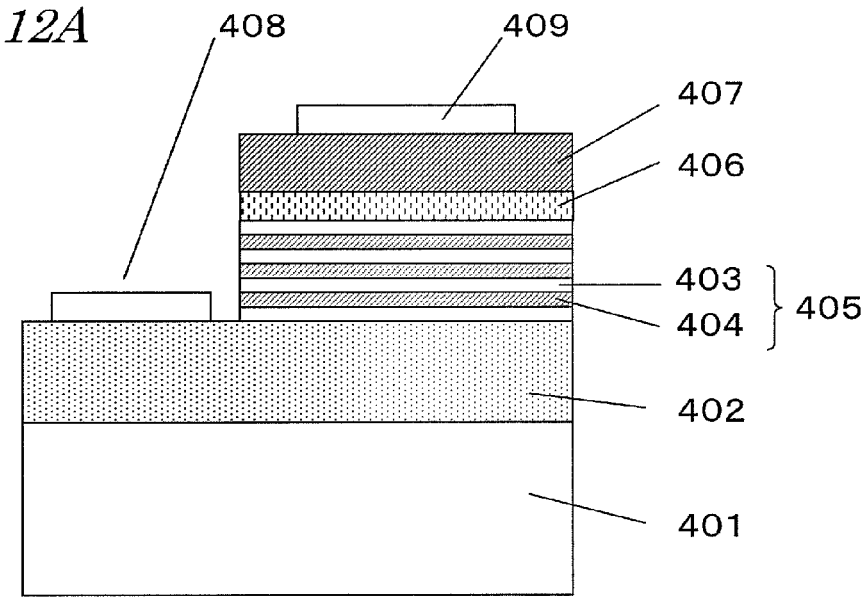
FIGS. 12A and 12B are cross-sectional views schematically illustrating the respective structures of a gallium nitride-based compound semiconductor light-emitting element and a multi-quantum well active layer according to a second embodiment of the present disclosure, respectively.
Figure 12B:
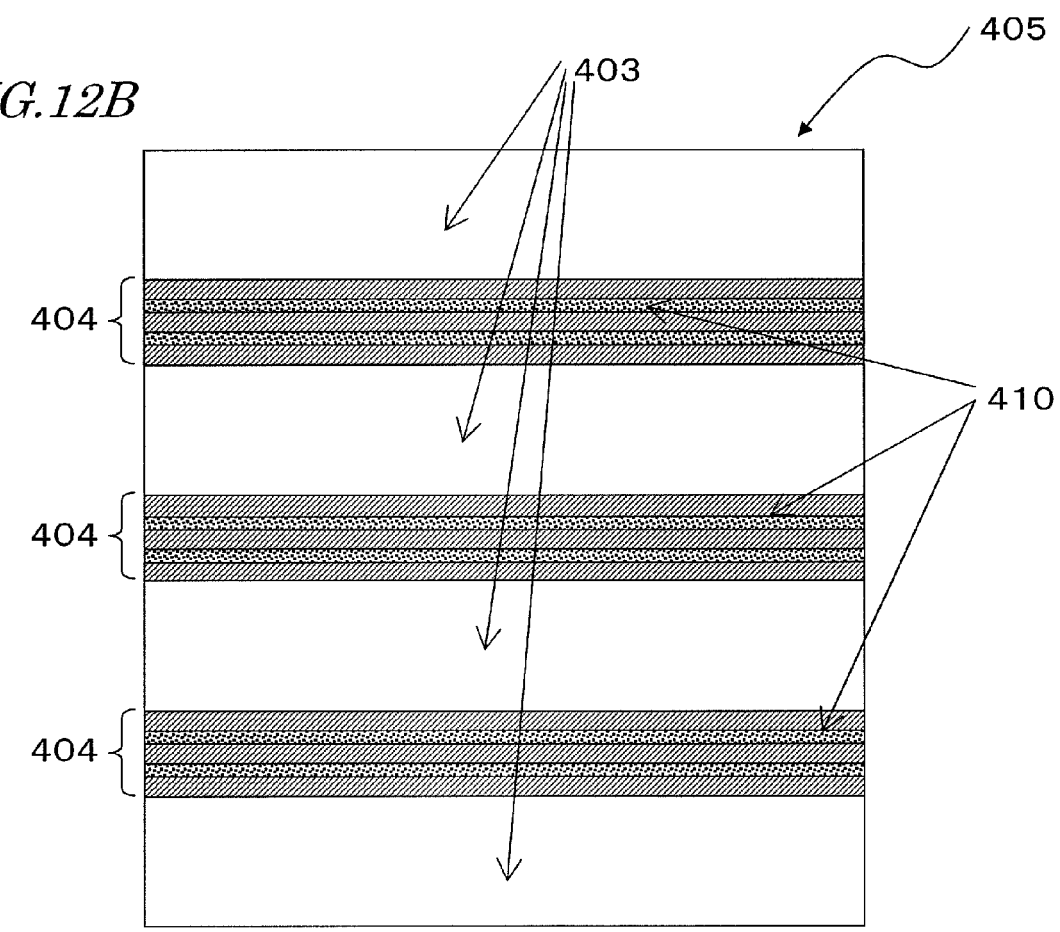

As shown in FIGS. 12A and 12B, the nitride semiconductor light-emitting element of this embodiment includes a GaN/InGaN multi-quantum well active layer 405, of which the growing plane is a non-polar plane. The GaN/InGaN multi-quantum well active layer 405 includes a number of $In_yGa_{1-y}N$ (where $0<y<1$) well layers 404, each including In, and a number of GaN barrier layers 403, each of which is arranged on an associated one of the $In_yGa_{1-y}N$ (where $0<y<1$) well layers 404.

As shown in FIGS. 12A and 12B, Si-doped layers 410 are arranged in the $In_yGa_{1-y}N$ (where $0<y<1$) well layers 404. Specifically, two Si-doped layers 410 are arranged in each $In_yGa_{1-y}N$ (where $0<y<1$) well layer 404 and divide each single $In_yGa_{1-y}N$ (where $0<y<1$) well layer 404 into multiple portions, each having a thickness of 3 nm or less.

It should be noted that even if no In is supplied intentionally to the Si-doped layers 410, In could be observed in the Si-doped layers 410 depending on the resolution of the measuring system. In that case, the In concentration in the Si-doped layers 410 may be less than 90% of the In concentration in the rest of the $In_yGa_{1-y}N$ (where $0<y<1$) well layers 404 other than the Si-doped layers 410. As a result, vaporization or loss of In atoms from the well layers can be reduced efficiently and the depth direction distribution of the In composition in the well layers can be even more uniform.

Hereinafter, it will be described how to fabricate the nitride semiconductor light-emitting element of this embodiment.

In this embodiment, an m-plane GaN substrate, of which the growing plane was a non-polar plane, was used as a crystal growing substrate 401. Alternatively, the substrate 401 may also be an m-plane SiC substrate, of which the surface is covered with an m-plane GaN layer, or an r-plane or m-plane sapphire substrate, of which the surface is covered with an m-plane GaN layer. The point is that the active layer be an m-plane nitride-based semiconductor layer.

The gallium nitride-based compound semiconductor layers to form the GaN/InGaN multi-quantum well active layer 405 and other layers were deposited by an MOCVD method. First of all, before crystals start to be grown, the substrate 401 is washed using a buffered hydrofluoric acid (BHF) solution, rinsed with water, and then dried sufficiently. The substrate 401 that has been washed in this manner is loaded into the reaction chamber of an MOCVD system without being exposed to the air as successfully as possible. Thereafter, with only ammonia ($NH_3$) gas supplied as a nitrogen source gas, the substrate is heated to approximately 850 degrees Celsius to clean the surface of the substrate.

Next, with a trimethylgallium (TMG) gas or a triethylgallium (TEG) gas and a silane ($SiH_4$) gas supplied, the substrate is heated to about 1100 degrees Celsius to deposit an n-GaN layer 402. The silane gas is the source gas of Si as an n-type dopant.

Next, the supply of the $SiH_4$ gas is stopped and the temperature of the substrate is lowered to less than 800 degrees Celsius to form a GaN barrier layer 403. In addition, a trimethylindium (TMI) gas also starts to be supplied to deposit an $In_yGa_{1-y}N$ (where $0<y<1$) well layer 404. In this embodiment, by alternately depositing the GaN barrier layers 403 and $In_yGa_{1-y}N$ (where $0<y<1$) well layers 404 in two or more cycles, a GaN/InGaN multi-quantum well active layer 405 that will emit light is formed.

In this embodiment, Si-doped layers 410 are formed in each $In_yGa_{1-y}N$ (where $0<y<1$) well layer 404 by the method to be described in detail later.

Figure 13:
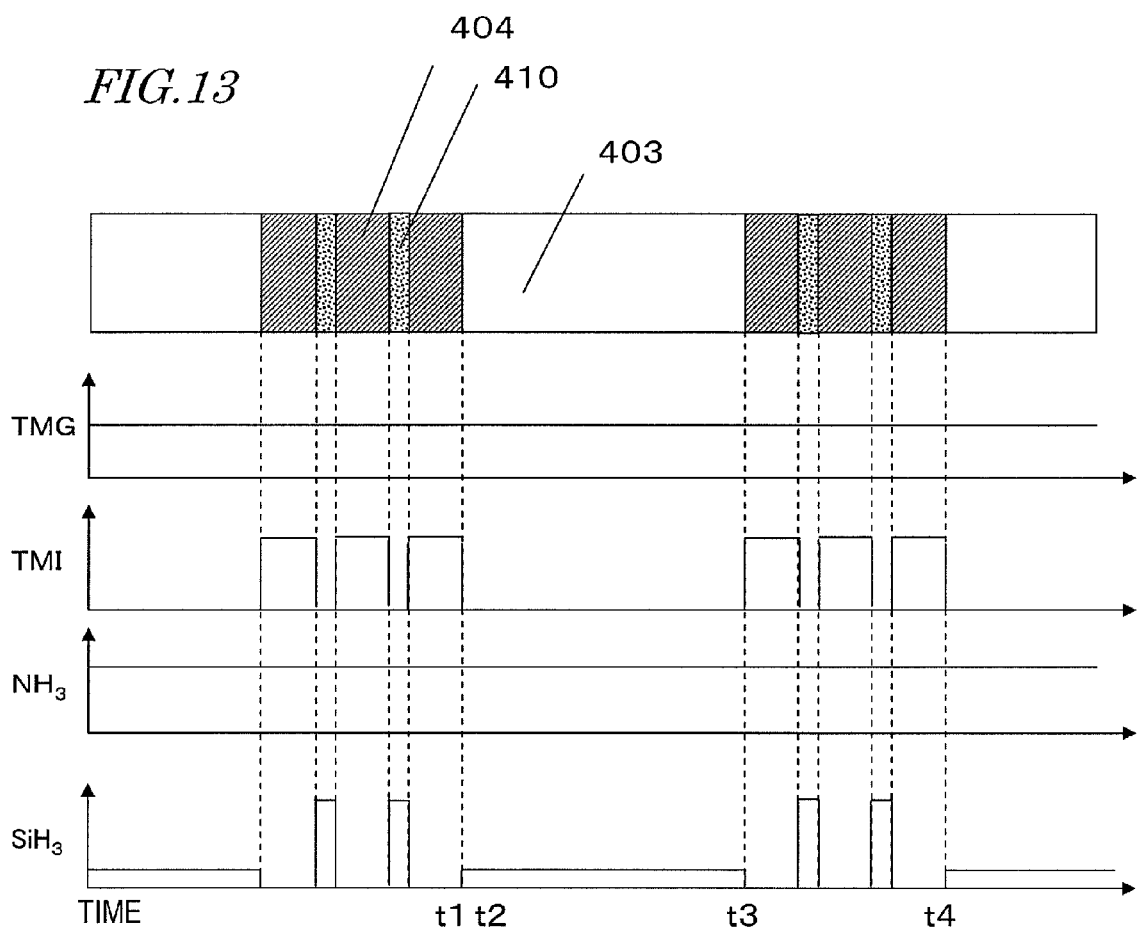
FIG. 13 is a schematic representation showing an exemplary growth sequence to be adopted when an active layer is formed for a gallium nitride-based compound semiconductor light-emitting element according to the second embodiment of the present disclosure.

Hereinafter, an exemplary process for forming the GaN/InGaN multi-quantum well active layer 405 will be described with reference to FIG. 13, which shows a cross-sectional structure of the GaN/InGaN multi-quantum well active layer 405 to be formed in this embodiment and an example of a source gas supply sequence while the active layer is being formed. In the example illustrated in FIG. 13, three GaN barrier layers 403 and two $In_yGa_{1-y}N$ (where $0<y<1$) well layers 404 are stacked alternately. These GaN barrier layers 403 and $In_yGa_{1-y}N$ (where $0<y<1$) well layers 404 grow from the left to the right on the paper on which FIG. 13 is drawn and the bold arrow shown in FIG. 13 indicates the "thickness direction".

In this embodiment, in starting to deposit an $In_yGa_{1-y}N$ (where $0<y<1$) well layer 404, $NH_3$, TMG and trimethylindium (TMI) gases are supplied. When the well layer is deposited to an intended thickness, the supply of the trimethylindium (TMI) gas is stopped and the supply of $SiH_4$ gas is started at a time t11. And before the Si-doped layer 410 becomes as thick as one to three atomic layers (at a time t12), the supply of the $SiH_4$ gas is stopped and the supply of the TMI gas is started again. Although the Si-doped layer 410 is illustrated as a definite "layer" in FIG. 13, the Si concentration does not have to change stepwise at the interface of the Si-doped layer 410. As long as there is a portion having a locally increased Si concentration in the vicinity of the interface of the GaN barrier layer 403 and if that portion runs parallel in the in-plane direction, then that portion is the "Si-doped layer 410".

When each Si-doped layer 410 deposited becomes as thick as one to three atomic layers (i.e., is deposited to a thickness of not less than 0.3 nm and not more than 0.8 nm), $NH_3$, TMI and TMG gases are supplied from a time t13 through a time t14 to deposit an $In_yGa_{1-y}N$ (where $0<y<1$) well layer 404 to an intended thickness. By performing such a process step a number of times, $In_yGa_{1-y}N$ (where $0<y<1$) well layers 404 and Si-doped layers 410 are formed alternately.

In this embodiment, the growing condition was adjusted by the method described above so that the emission wavelength would be around 450 nm to form a GaN/InGaN multi-quantum well active layer C (representing a comparative example) in which InGaN well layers, each having a thickness of 9 nm, and GaN barrier layers, each having a thickness of 15 nm, were alternately stacked in three cycles. In addition, another GaN/InGaN multi-quantum well active layer D was separately formed as a specific example of the present disclosure. In the multi-quantum well active layer D, InGaN well layers, in each of which two Si-doped layers, each having a thickness of 0.8 nm, were arranged at an interval of 3 nm and each of which had an overall thickness of 10.6 nm, and barrier layers, each having a thickness of 15 nm, were alternately stacked in three cycles. Specifically, the growing condition included a growing temperature of 750 degrees Celsius, a growing pressure of 300 Torr, a TMG supply flow rate of 33 μmol/min and an $NH_3$ supply flow rate of 0.8 mol/min in both cases. These flow rates were kept constant but TMI was supplied at a flow rate of 170 µmol/min only while the InGaN well layer was being deposited.

The comparative example (C) that had been made by the standard method described above and the specific example (D) in which an Si-doped layer had been inserted into each well layer had their photoluminescence (PL) measured. As a result, the specific example (D) had a peak wavelength that was about 20 nm longer than, approximately twice as high an emission intensity as, and a half width that was about 5 nm shorter than, in the comparative example (C). These results reveal that the uniformity in In composition increased in the in-plane and thickness directions in the $In_yGa_{1-y}H$ (where $0<y<1$) well layer 404. According to this embodiment, it is possible to prevent the emission spectrum from becoming too broad and to increase the yield of the emission wavelength.

Now take a look at FIG. 12 again.

After the GaN/InGaN multi-quantum well active layer 405 has been deposited, the supply of the TMI gas is stopped and the hydrogen gas starts to be supplied again as a carrier gas, in addition to the nitrogen gas. Furthermore, the growing temperature is raised to the range of 850-1000 degrees Celsius, and trimethylaluminum (TMA) and bis(cyclopentadienyl) magnesium ($Cp_2Mg$), which is a source gas of Mg as a p-type dopant, are supplied to form a p-AlGaN overflow suppressing layer 406. Next, the supply of the TMA gas is stopped to deposit a p-GaN layer 407.

Thereafter, the substrate is unloaded from the reaction chamber and only predetermined portions of the p-GaN layer 407, p-AlGaN overflow suppressing layer 406 and GaN/InGaN multi-quantum well active layer 405 are removed by performing photolithography and etching processes, for example, to expose a portion of the n-GaN layer 402. On the exposed region of the n-GaN layer 402, an n-side electrode 408 consisting of Ti/Al layers is formed. On the other hand, a p-side electrode 409 may consist of Pd/Pt layers, for example.

By performing these process steps, n-type carriers and p-type carriers can be injected, and a light-emitting element, of which the GaN/InGaN multi-quantum well active layer 405 fabricated by the method of this embodiment can emit light at an intended wavelength, can be obtained.

(Embodiment 3)

The light-emitting element of the first or second embodiment described above could be used as it is as a light source. However, if the light-emitting element of the first or second embodiment is combined with a resin including a phosphor that changes the wavelength, for example, the element can be used effectively as a light source having an expanded operating wavelength range (such as a white light source).

Figure 14:
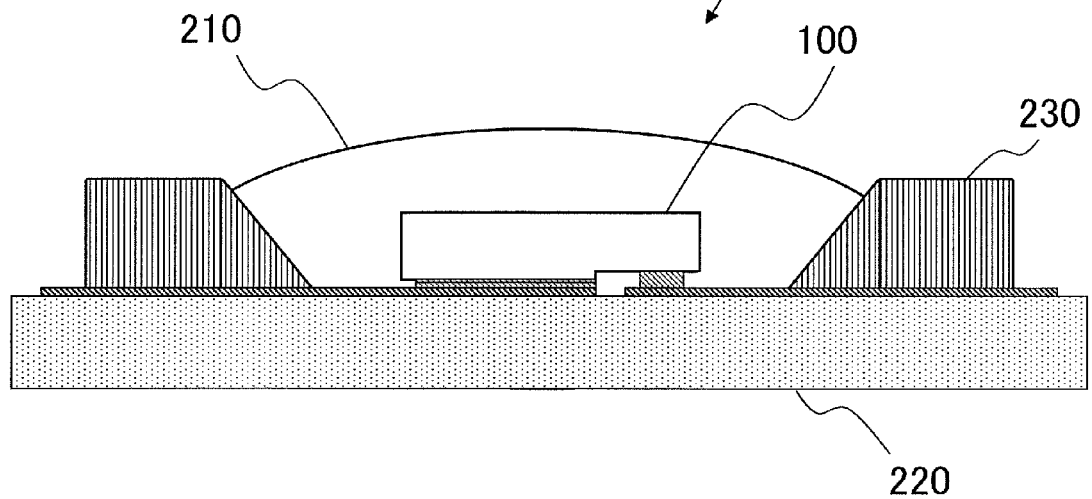
FIG. 14 is a cross-sectional view illustrating an embodiment of a white light source.

FIG. 14 is a schematic representation illustrating an example of such a white light source. The light source shown in FIG. 14 includes a light-emitting element 100 having the structure shown in FIG. 7 and a resin layer 210 in which particles of a phosphor such as YAG (yttrium aluminum garnet) are dispersed to change the wavelength of the light emitted from the light-emitting element 100 into a longer one. The light-emitting element 100 is mounted on a supporting member 220 on which a wiring pattern has been formed. And on the supporting member 220, a reflective member 230 is arranged so as to surround the light-emitting element 100. The resin layer 210 has been formed so as to cover the light-emitting element 100.

As can be seen from the foregoing description, according to the first to third embodiments, even if a nitride semiconductor such as a gallium nitride-based compound semiconductor is grown on a growing plane that is a non-polar plane (such as an m-plane), high-concentration In can also be distributed uniformly parallel to the growing plane and in the thickness direction. As a result, a well layer that achieves high internal quantum efficiency can be formed with the yield of the emission wavelength increased.

A nitride semiconductor light-emitting element and light source according to an aspect of the present disclosure may be used in an illumination unit, for example.

While the present disclosure has been described with respect to exemplary embodiments thereof, it will be apparent to those skilled in the art that the disclosed disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A nitride semiconductor light-emitting element, comprising an active layer including a well layer and a barrier layer that is arranged on the well layer, the active layer having a growing plane which is a non-polar plane,
   wherein the well layer includes In,
   the barrier layer includes an Si-doped layer,
   a concentration of Si at one interface of the barrier layer on a growing direction side is either zero or lower than a concentration of Si in the Si-doped layer,
   the Si-doped layer is located within a range corresponding to not more than 50% of the thickness of the barrier layer as measured from an interface between the barrier layer and the well layer,
   the Si-doped layer has a thickness of not more than 0.8 nm, and
   the Si-doped layer has an Si composition ratio of less than 0.1%.

2. The nitride semiconductor light-emitting element of claim 1, wherein the well layer has a thickness of not less than 3 nm.

3. The nitride semiconductor light-emitting element of claim 1, wherein the well layer has an In composition ratio of not less than 5%.

4. The nitride semiconductor light-emitting element of claim 1, wherein the maximum and minimum values of the concentration of In as measured in the thickness direction of the well layer have a difference of not more than 10%.

5. The nitride semiconductor light-emitting element of claim 1, wherein the barrier layer includes an n-type dopant in a region other than the Si-doped layer, and the n-type dopant is at least one of silicon, oxygen, germanium and tin.

6. The nitride semiconductor light-emitting element of claim 1, wherein the thickness of the Si-doped layer is not more than 10% of the thickness of the barrier layer.

7. The nitride semiconductor light-emitting element of claim 1, wherein the concentration of Si in the Si-doped layer is lower than a concentration of In included in the well layer.

8. The nitride semiconductor light-emitting element of claim 1, wherein the Si-doped layer is in contact with the well layer.

9. The nitride semiconductor light-emitting element of claim 1, wherein the Si-doped layer has a thickness of not less than 0.3 nm.

10. The nitride semiconductor light-emitting element of claim 1, wherein the thickness of the Si-doped layer is not more than 50% of the thickness of the barrier layer.

11. The nitride semiconductor light-emitting element of claim 1, wherein a normal line to the growing plane of the active layer and a normal line to the m-plane define an angle of not more than 5 degrees.

12. A light source comprising:
the nitride semiconductor light-emitting element of claim 1; and
a wavelength changing portion including a phosphor which changes a wavelength of light emitted from the nitride semiconductor light-emitting element.

13. The nitride semiconductor light-emitting element of claim 2, wherein the well layer has a thickness of not more than 20 nm.

14. The nitride semiconductor light-emitting element of claim 3, wherein the well layer has an In composition ratio of not more than 30%.

15. The nitride semiconductor light-emitting element of claim 5, wherein the concentration of Si in the Si-doped layer is higher than a concentration of the n-type dopant in the barrier layer.

16. A nitride semiconductor light-emitting element, comprising an active layer including a well layer and a barrier layer that is arranged on the well layer, the active layer having a growing plane which is a non-polar plane,
wherein the well layer includes In,
the well layer includes an Si-doped layer having a thickness of not more than 0.8 nm,
in the well layer, the Si-doped layer is not in contact with an interface between the well layer and the barrier layer,
a concentration of Si at one interface of the barrier layer on a growing direction side is either zero or lower than a concentration of Si in the Si-doped layer, and
the Si-doped layer is obtained by doping $Al_aIn_bGa_cN$, where $0 \leq a \leq 1$, $0 \leq b < 1$ and $0 < c \leq 1$, with Si.

17. The nitride semiconductor light-emitting element of claim 16, wherein the well layer is formed of $Al_xIn_yGa_zN$, where $0 \leq x < 1$, $0 < y < 1$ and $0 < z < 1$.

18. The nitride semiconductor light-emitting element of claim 16, wherein the Si-doped layer divides the well layer into multiple portions, each having a thickness of not more than 3 nm.

19. The nitride semiconductor light-emitting element of claim 16, wherein a concentration of In included in the Si-doped layer is less than 90% of a concentration of In included in the rest of the well layer other than the Si-doped layer.

20. The nitride semiconductor light-emitting element of claim 16, wherein the si-doped layer has a thickness of not less than 0.3 nm.

* * * * *